United States Patent
Kim et al.

(10) Patent No.: US 9,647,695 B2
(45) Date of Patent: May 9, 2017

(54) MEMORY CONTROLLERS AND FLASH MEMORY READING METHODS

(71) Applicant: Samsung Electronics Co., Ltd., Suwon-Si, Gyeonggi-Do (KR)

(72) Inventors: Kyung-jin Kim, Uiwang-si (KR); Ung-hwan Kim, Seongnam-si (KR); Eun-cheol Kim, Seongnam-si (KR); Jun-jin Kong, Yongin-si (KR); Se-jin Lim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 13 days.

(21) Appl. No.: 14/601,659

(22) Filed: Jan. 21, 2015

(65) Prior Publication Data

US 2015/0220389 A1 Aug. 6, 2015

(30) Foreign Application Priority Data

Feb. 3, 2014 (KR) .................. 10-2014-0012214

(51) Int. Cl.
*G06F 11/10* (2006.01)
*H03M 13/37* (2006.01)
*H03M 13/11* (2006.01)

(52) U.S. Cl.
CPC ..... *H03M 13/3738* (2013.01); *G06F 11/1048* (2013.01); *H03M 13/3715* (2013.01); *H03M 13/3746* (2013.01); *H03M 13/1108* (2013.01); *H03M 13/1111* (2013.01)

(58) Field of Classification Search
CPC .................................. G06F 11/1008
USPC .......................... 714/763, 773, 780, 764, 721
See application file for complete search history.

(56) References Cited

U.S. PATENT DOCUMENTS

| | | | |
|---|---|---|---|
| 7,388,781 B2 | 6/2008 | Litsyn et al. | |
| 8,156,403 B2 | 4/2012 | Shalvi et al. | |
| 8,286,048 B1 | 10/2012 | Chen et al. | |
| 8,479,083 B2 * | 7/2013 | Chae ............... | G11C 11/5642 714/721 |
| 2005/0120286 A1 | 6/2005 | Akamatsu | |
| 2008/0266945 A1 * | 10/2008 | Hou ................ | G11C 11/5642 365/185.03 |
| 2011/0231738 A1 * | 9/2011 | Horisaki .......... | G06F 11/1072 714/773 |
| 2011/0239082 A1 | 9/2011 | Yang | |
| 2012/0131415 A1 | 5/2012 | Park et al. | |
| 2012/0297273 A1 | 11/2012 | Sakaue et al. | |
| 2013/0077400 A1 | 3/2013 | Sakurada | |

(Continued)

FOREIGN PATENT DOCUMENTS

| | | |
|---|---|---|
| JP | 2009-271852 A | 11/2009 |
| KR | 2003-0016720 A | 3/2003 |

*Primary Examiner* — Fritz Alphonse
(74) *Attorney, Agent, or Firm* — Harness, Dickey & Pierce, P.L.C.

(57) ABSTRACT

A method of reading multi-bit data stored in a memory cell of a flash memory includes attempting to perform hard decision (HD) decoding on output data from the flash memory, and performing soft decision (SD) decoding on the output data when the HD decoding cannot be performed. The performing of the SD decoding includes: changing a maximum number of iterations according to a threshold voltage distribution of the memory cell; and performing the SD decoding based on the changed maximum number of iterations.

17 Claims, 19 Drawing Sheets

(56) References Cited

U.S. PATENT DOCUMENTS

2013/0173982 A1    7/2013   Moon et al.
2015/0227314 A1*   8/2015   Chen .................. G06F 11/1012
                                                                             714/764

* cited by examiner

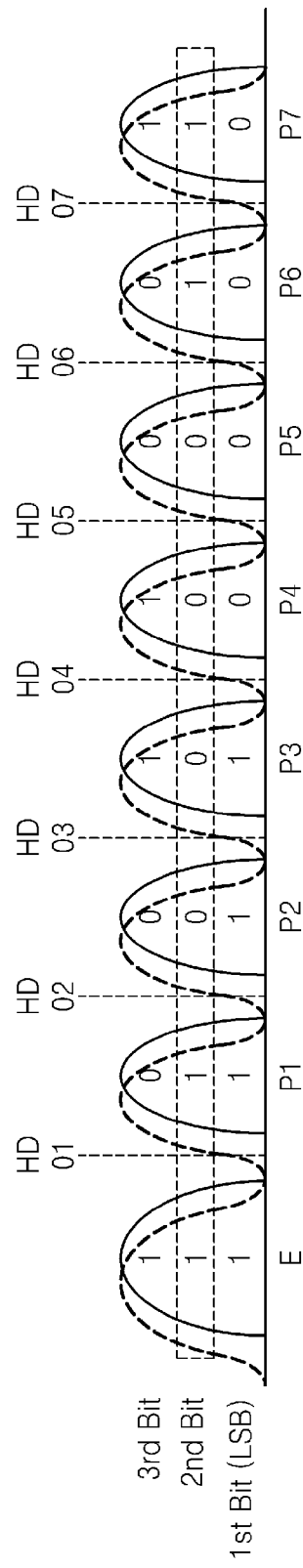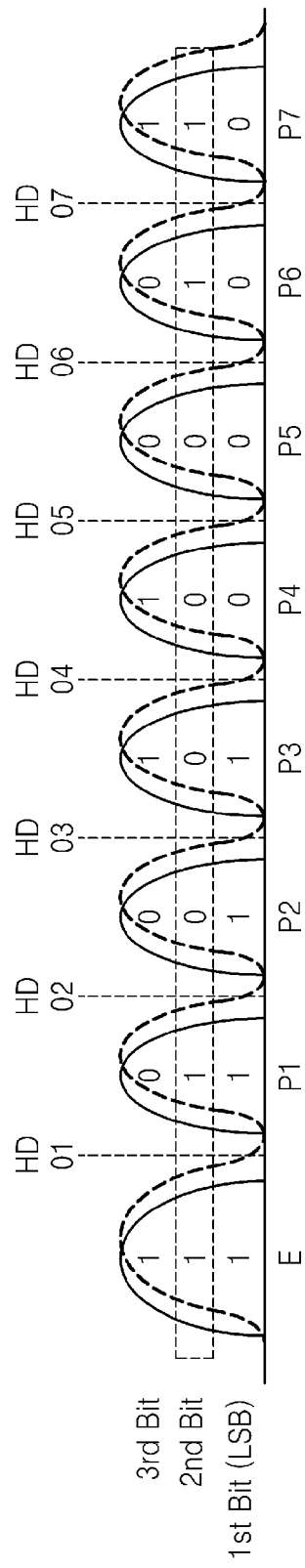

MEMORY CONTROLLERS AND FLASH MEMORY READING METHODS

CROSS-REFERENCE TO RELATED APPLICATIONS

This application claims priority under 35 U.S.C. §119 to Korean Patent Application No. 10-2014-0012214, filed on Feb. 3, 2014, in the Korean Intellectual Property Office, the disclosure of which is incorporated herein in its entirety by reference.

BACKGROUND

Field

One or more example embodiments of inventive concepts relate to memory controllers and methods of controlling memories, and more particularly, to memory controllers and flash memory reading methods that use various decoding methods according to threshold voltage distributions of flash memory cells.

Description of Conventional Art

A conventional semiconductor memory device detects and corrects data errors using encoding and decoding technology based on error correction codes. One example of an error correction code is a low density parity check (LDPC) code, which is an error correction code that uses a probability-based repeated calculation. However, decoding time in a reading process of a flash memory using such an LDPC code may be relatively lengthy.

SUMMARY

At least some example embodiments of inventive concepts provide reading methods for flash memories, which use various decoding methods according to a threshold voltage distribution of flash memory cells.

At least some other example embodiments provide memory controllers to read data from flash memories.

At least one example embodiment provides a method of reading multi-bit data stored in a memory cell of a flash memory, the method including: attempting to perform hard decision (HD) decoding on output data from the flash memory; and performing soft decision (SD) decoding on the output data when the HD decoding cannot be performed. The performing the SD decoding includes: changing a maximum number of iterations of the SD decoding according to a threshold voltage distribution of the memory cell; and performing the SD decoding based on the changed maximum number of iterations.

The changing the maximum number of iterations may include adjusting the maximum number of iterations based on a number of first cells having a threshold voltage between an HD read voltage and a first SD read voltage at a low voltage side of the HD read voltage, and a number of second cells having a threshold voltage between the HD read voltage and a second SD read voltage at a high voltage side of the HD read voltage, in adjacent data states of the threshold voltage distribution.

The maximum number of iterations may be adjusted to be less than an initial maximum number of iterations when a difference between the number of first cells and the number of second cells is greater than or equal to a threshold.

The maximum number of iterations may be adjusted to be greater than an initial maximum number of iterations when a difference between the number of first cells and the number of second cells is less than or equal to a threshold.

The maximum number of iterations may be adjusted to be less than an initial maximum number of iterations when a sum of the number of first cells and the number of second cells is greater than or equal to a threshold.

The method may further include measuring the number of first cells and the number of second cells when the HD decoding cannot be performed.

At least one other example embodiment provides a method of reading multi-bit data stored in a memory cell of a flash memory, the method including: attempting to perform hard decision (HD) decoding on output data from the flash memory; and performing soft decision (SD) decoding on the output data when the HD decoding cannot be performed. The attempting to perform the HD decoding includes: changing a maximum number of iterations of the HD decoding based on a success rate of an HD decoding stage of the HD decoding; and performing the HD decoding based on the changed maximum number of iterations of the HD decoding.

The changing the maximum number of iterations may include setting the maximum number of iterations of the HD decoding to be less than an initial maximum number of iterations when the HD decoding stage has a minimum success rate in the performing of the HD decoding.

The changing the maximum number of iterations may include: setting the maximum number of iterations of the HD decoding to be greater than an initial maximum number of iterations when the HD decoding stage has a maximum success rate in the performing of the HD decoding.

The performing the SD decoding may include: changing a maximum number of iterations of the SD decoding based on a success rate of an SD decoding stage of the SD decoding; and performing the SD decoding based on the changed maximum number of iterations of the SD decoding.

The changing the maximum number of iterations of the SD decoding may include setting the maximum number of iterations of the SD decoding to be less than an initial maximum number of iterations when the SD decoding stage has a minimum success rate in the performing of the SD decoding.

The changing the maximum number of iterations of the SD decoding may include: setting the maximum number of iterations of the SD decoding to be greater than an initial maximum number of iterations when the SD decoding stage has a maximum success rate in the performing of the SD decoding.

The success rate of the HD decoding stage and the success rate of the SD decoding stage may be stored in the flash memory.

The success rate of the HD decoding stage and the success rate of the SD decoding stage may be obtained based on a read operation in a test process after manufacturing the flash memory.

The success rate of the HD decoding stage and the success rate of the SD decoding stage may be obtained based on a read operation during use of the flash memory.

At least one other example embodiment provides a memory controller to read multi-bit data stored in a memory cell of a flash memory. According to this example embodiment, the memory controller includes an error correction circuit configured to: attempt hard decision (HD) decoding of output data from the memory cell of the flash memory; and perform soft decision (SD) decoding of the output data if the HD decoding is unsuccessful, a maximum number of iterations of the SD decoding being set based on a threshold voltage distribution for the memory cell.

The error correction circuit may be further configured to set the maximum number of iterations based on a number of first cells having a threshold voltage between an HD read voltage and a first SD read voltage at a low voltage side of the HD read voltage, and a number of second cells having a threshold voltage between the HD read voltage and a second SD read voltage at a high voltage side of the HD read voltage.

The error correction circuit may be further configured to set the maximum number of iterations to be less than an initial maximum number of iterations if a difference between the number of first cells and the number of second cells is greater than or equal to a threshold.

The error correction circuit may be further configured to set the maximum number of iterations to be greater than an initial maximum number of iterations if a difference between the number of first cells and the number of second cells is less than or equal to a threshold.

The error correction circuit may be further configured to set the maximum number of iterations to be less than an initial maximum number of iterations if a sum of the number of first cells and the number of second cells is greater than or equal to a threshold.

At least one other example embodiment provides a memory controller to read multi-bit data stored in a memory cell of a flash memory. According to at least this example embodiment, the memory controller includes an error correction circuit configured to: attempt hard decision (HD) decoding of output data from the memory cell of the flash memory, a maximum number of iterations of the HD decoding being set according to a success rate of a stage of the HD decoding; and perform soft decision (SD) decoding on the output data if the HD decoding is unsuccessful.

The error correction circuit may be further configured to set the maximum number of iterations of the HD decoding to be less than an initial maximum number of iterations if the HD decoding stage has a minimum success rate of the HD decoding.

The error correction circuit may be further configured to set the maximum number of iterations of the HD decoding to be greater than an initial maximum number of iterations if the HD decoding stage has a maximum highest success rate of the HD decoding.

The error correction circuit may be further configured to: set a maximum number of iterations of the SD decoding according to a success rate of an SD decoding stage of the SD decoding; and perform the SD decoding based on the set maximum number of iterations of the SD decoding.

BRIEF DESCRIPTION OF THE DRAWINGS

Example embodiments of inventive concepts will be more clearly understood from the following detailed description taken in conjunction with the accompanying drawings in which:

FIGS. 5, 6A, and 6B are diagrams illustrating an example threshold voltage distribution formed in a cell of a multi-bit flash memory by a program operation;

DETAILED DESCRIPTION

Figure 1:
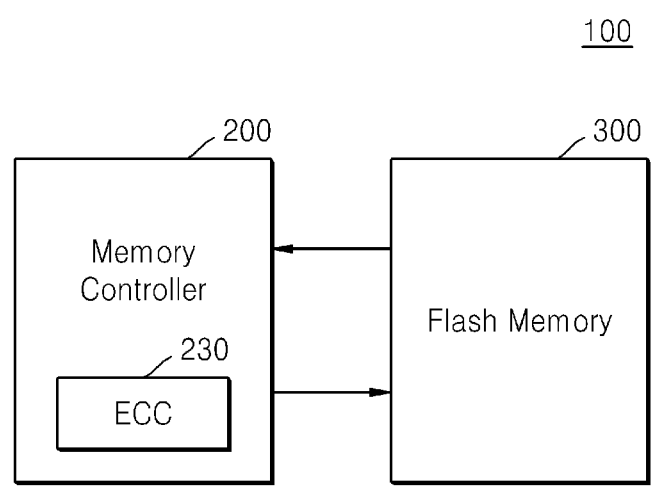
FIG. 1 is a block diagram of a memory system using flash memory reading methods, according to example embodiments of inventive concepts.

The attached drawings for illustrating example embodiments of inventive concepts are referred to in order to gain a sufficient understanding of inventive concepts, the merits thereof, and the objectives accomplished by the implementation of inventive concepts.

Hereinafter, inventive concepts will be described more fully with reference to the accompanying drawings, in which example embodiments are shown. The inventive concepts may, however, be embodied in many different forms and should not be construed as being limited to the embodiments set forth herein; rather, these embodiments are provided so that this disclosure will be thorough and complete, and will fully convey the inventive concept to those skilled in the art. In the drawings, like reference numerals denote like elements, and the dimensions of structures may be exaggerated for clarity.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As discussed herein, example embodiments and/or one or more components thereof (e.g., memory controller, error correction circuit or unit, control logic, encoder, decoder, row selection circuit or unit, column selection circuit or unit, page buffer circuit or unit, voltage generator, etc.) may be hardware, firmware, hardware executing software or any combination thereof. When example embodiments and/or one or more components thereof are hardware, such hardware may include one or more Central Processing circuits (CPUs), system-on-chips (SOCs), digital signal processors (DSPs), application-specific-integrated-circuits (ASICs), field programmable gate arrays (FPGAs), computers or the like configured as special purpose machines to perform the functions of example embodiments and/or one or more components thereof. CPUs, SOCs, DSPs, ASICs, FPGAs, and computers may sometimes generally be referred to as processors and/or microprocessors.

Expressions such as "at least one of," when preceding a list of elements, modify the entire list of elements and do not modify the individual elements of the list.

Semiconductor memory devices may be classified as volatile memory devices (e.g., as dynamic random-access memory (DRAM) and static RAM (SRAM)) or nonvolatile memory devices (e.g., electrically erasable programmable read only memory (EEPROM), ferro-electric RAM (FRAM), phase-change RAM (PRAM), magneto-resistive RAM (MRAM), and flash memory). Volatile memory devices lose stored data when power supplied to the memory is cut off, whereas nonvolatile memory devices maintain stored data even after power thereto is cut off. Flash memory devices may have relatively high programming speeds, relatively low power consumption, and/or relatively high data storage capacities. As a result, flash memory devices are relatively widely used as storage mediums in computing systems.

In a flash memory, data states of each memory cell may be determined according to the number of bits stored in each memory cell. A memory cell storing 1-bit data is referred to as a single-bit cell or a single-level cell (SLC). A memory cell storing multi-bit data (e.g., two or more bits) is referred to as a multi-bit cell, a multi-level cell (MLC), or a multi-state cell. The multi-bit cell is advantageous for higher integration of flash memory. However, as the number of bits that are programmed into one memory cell increases, the reliability of the memory cell decreases, which results in increased read failure rate.

For example, in order to program k bits into one memory cell, any one of $2^k$ threshold voltages is formed in the memory cell. Due to a relatively small (e.g., minute) difference in electrical characteristics between memory cells, threshold voltages of memory cells in which the same data was programmed may form a threshold voltage distribution in a certain range. Each threshold voltage distribution may correspond to each of $2^k$ data values formed by k bits.

However, due to limitations in a voltage window in which threshold voltage distributions may be arranged, the distance between adjacent threshold voltages decreases as a result of an increase of k, and thus adjacent threshold voltage distributions may overlap with each other. As adjacent threshold voltage distributions overlap with each other, read data may include error bits. Accordingly, a method of more efficiently detecting and correcting read errors of data read from a flash memory storing multi-bit data may be advantageous.

A flash memory may detect and correct data errors using encoding and decoding technology based on error correction codes. An example error correction code is a low density parity check (LDPC) code, which is an error correction code using probability-based iterative calculation. A flash memory may detect and correct errors in read data through a decoding process using the LDPC code to perform data determination. According to at least some example embodiments of inventive concepts, methods of correcting errors in data read from a flash memory using LDPC decoding methods are described.

FIG. 1 is a block diagram of a memory system 100 using flash memory reading methods according to example embodiments of inventive concepts.

Referring to FIG. 1, the memory system 100 includes a memory controller 200 and a flash memory 300. The memory controller 200 may be configured to control the flash memory 300. The memory controller 200 may include an error correction circuit (ECC) 230 for correcting errors in data read from the flash memory 300. An example error correction method performed at the ECC 230 may be divided into a hard decision (HD) method and a soft decision (SD) method.

The HD method is a method of correcting errors in data by using only error correction codes and data (hereinafter, referred to as HD data) read according to On/Off characteristics of a memory cell when a read voltage Vread is applied to the memory cell. The SD method is a method of correcting errors of data by using additional information (hereinafter, referred to reliability data) for the reliability of the HD data as well as the HD data and the error correction codes. According to at least some example embodiments of inventive concepts, the number of times in which an error correction is performed in the HD method and/or the SD method is changed to perform more accurate error correction and/or reduce time required for error correction. This will be described in more detail below.

The memory controller 200 uses a flash memory reading method to read multi-bit data stored in a memory cell of the flash memory 300. The flash memory reading method includes performing HD decoding on read data output from the flash memory 300 and performing SD decoding on the read data when HD decoding may not be performed (e.g., when HD decoding is unsuccessful). The performing of SD decoding may include changing a maximum number of iterations of an LDPC decoding according to a threshold voltage distribution of the memory cell, and the performing the SD decoding based on the changed maximum number of iterations of the LDPC decoding.

The performing of HD decoding and the performing of SD decoding may include changing the maximum number of iterations of HD decoding and the maximum number of iterations of SD decoding according to a success rate of a HD decoding stage and a success rate of a SD decoding stage, respectively, and performing the HD decoding and SD decoding based on the changed maximum number of iterations of the HD decoding and the changed maximum number of iterations of the SD decoding, respectively.

The flash memory 300 may provide the ECC 230 of the memory controller 200 with data read from a memory cell storing multi-bit data during a read operation. A success rate of the HD decoding stage and a success rate of the SD decoding stage, which are obtained as a result of a read operation during a test process after a manufacturing process of the flash memory 300, may be stored in the flash memory 300. In addition, a success rate of the HD decoding stage and a success rate of the SD decoding stage, which are obtained as a result of a read operation during the use of the flash memory 300, may be stored in the flash memory 300.

Figure 2:
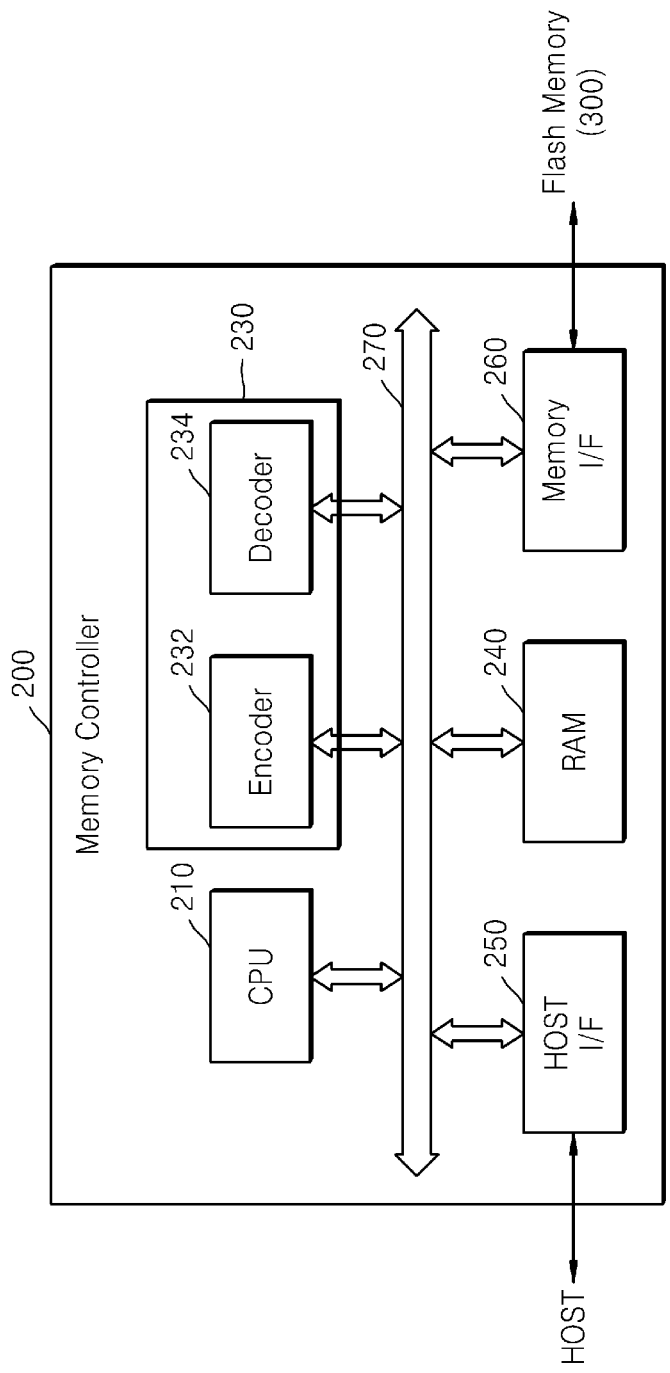
FIG. 2 is a block diagram of a memory controller illustrated in FIG. 1, according to an example embodiment of inventive concepts.

FIG. 2 is a block diagram of the memory controller 200 illustrated in FIG. 1, according to an example embodiment of inventive concepts.

Referring to FIG. 2, the memory controller 200 may include: a processor 210; an ECC 230; random access memory (RAM) 240; a host interface 250; a memory interface 260; and a bus 270. The ECC 230 may include: an encoder 232 for performing LDPC encoding; and a decoder 234 for performing LDPC decoding.

The processor 210 is electrically connected to the ECC 230, the RAM 240, the host interface 250, and the memory interface 260 via the bus 270. The bus 270 is a transmission path through which information is transmitted between elements of the memory controller 200. The processor 210 controls overall operations of the memory system 100 of FIG. 1. In more detail, the processor 110 decodes a command received from a host (not shown) and controls the memory system 100 to perform an operation according to the decoded result.

The processor 210 provides the flash memory 300 with a read command and an address during a read operation, and provides the flash device 300 with a write command, an address, and an encoded codeword during a writing operation. In addition, the processor 210 converts a logical address received from the host into a physical page address by using metadata stored in the RAM 240.

The RAM 240 temporarily stores data transmitted from the host and data generated by the processor 110, or data read out from the flash memory 300. Also, the RAM 240 may store metadata read out from the flash memory 300. Metadata is information generated by the memory system 100 in order to manage the flash memory 300. The metadata includes mapping table information that is used to convert logical addresses into physical page addresses (PPA) of the flash memory 300. Also, the metadata may include information for managing storage of the flash memory 300. In addition, the RAM 240 may store scheduling information obtained by manipulating a low density parity check (LDPC) bipartite graph read from the flash memory 300. The scheduling information may include information representing message exchange order between check nodes and variable nodes of the LDPC bipartite graph. The RAM 240 may be dynamic RAM (DRAM), static RAM (SRAM), or the like.

The host interface 250 includes a protocol for data exchange with the host and connects the flash memory 300 and the host to each other. The host interface 250 may be an advanced technology attachment (ATA) interface, a serial advanced technology attachment (SATA) interface, a parallel advanced technology attachment (PATA) interface, a universal serial bus (USB) or a serial attached small computer system (SAS) interface, a small computer system interface (SCSI), an embedded multimedia card (eMMC) interface, or a Unix file system (UFS) interface. The host interface 250 may exchange commands, addresses, and/or data with the host according to control of the processor 210.

The memory interface 260 may be configured to support the interface with the flash memory 300. The memory interface 260 may be configured so that software and hardware interleaving operations may be selectively performed via a plurality of channels.

When electric power is supplied to the memory system 100, the processor 210 controls the memory system 100 to read the metadata stored in the flash memory 300 and store the metadata in the RAM 240. The processor 210 controls the memory system 100 to update the metadata stored in the RAM 240 according to an operation of generating metadata change in the flash memory 300. In addition, the processor 210 controls the memory system 100 to write the metadata stored in the RAM 240 into the flash memory 300 before the memory system 100 is turned off (POWER OFF).

The processor 210 controls the memory controller 200 to perform an LDPC encoding process of information words received from the host in the encoder 232 during the write operation, and to perform an LDPC decoding process of the data read from the flash memory 300 in the decoder 130 during the read operation.

The encoder 232 generates a codeword by adding a plurality of parity bits specified by an LDPC code to the information word received from the host. In one example, if the bit number of the codeword is N and the bit number of the information word is K, then the parity bit number is N−K. Each of the parity bits of the LDPC codeword is set to satisfy the LDPC code.

Figure 8:
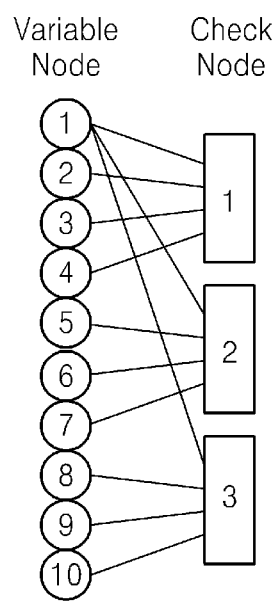
FIGS. 8 and 9 are diagrams for explaining a low density parity check (LDPC) decoding method that is used in flash memory reading methods, according to example embodiments of inventive concepts.

The decoder 234 performs the LDPC decoding process on the data read from the flash memory 300 by a codeword unit to recover the information word. The LDPC codes may be represented by a bipartite graph that is referred to as a Tanner graph. That is, for example, an edge may connect a variable node only to a check node, and may not connect the variable node to another variable node or the check node to another check node. In such a graph, a set of nodes (e.g., variable nodes) correspond to bits of the codeword and another set of nodes, and check nodes (also referred to as constraint nodes) correspond to a set of parity check constraints defining a code. The decoder 234 repeatedly performs check node update and variable node update while exchanging messages between the variable nodes and the check nodes based on an LDPC bipartite graph, for example, as shown in FIG. 8, until an error determination does not occur.

Figure 3:
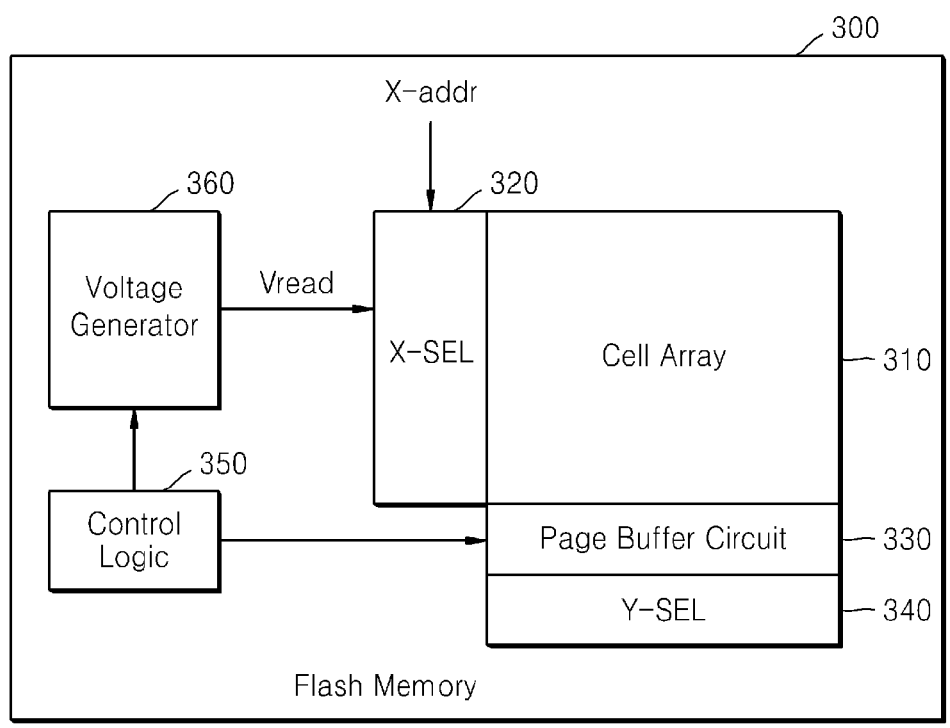
FIG. 3 is a block diagram of a flash memory illustrated in FIG. 1, according to an example embodiment of inventive concepts.

FIG. 3 is a block diagram of an example embodiment of the flash memory 300 illustrated in FIG. 1.

Referring to FIG. 3, the flash memory 300 may be a NAND-type flash memory. The flash memory 300 may include: a memory cell array 310; a row selection circuit (X-SEL) 320; a page buffer circuit 330; a column selection circuit (Y-SEL) 340; a control logic 350; and a voltage generation circuit 360.

Figure 4:
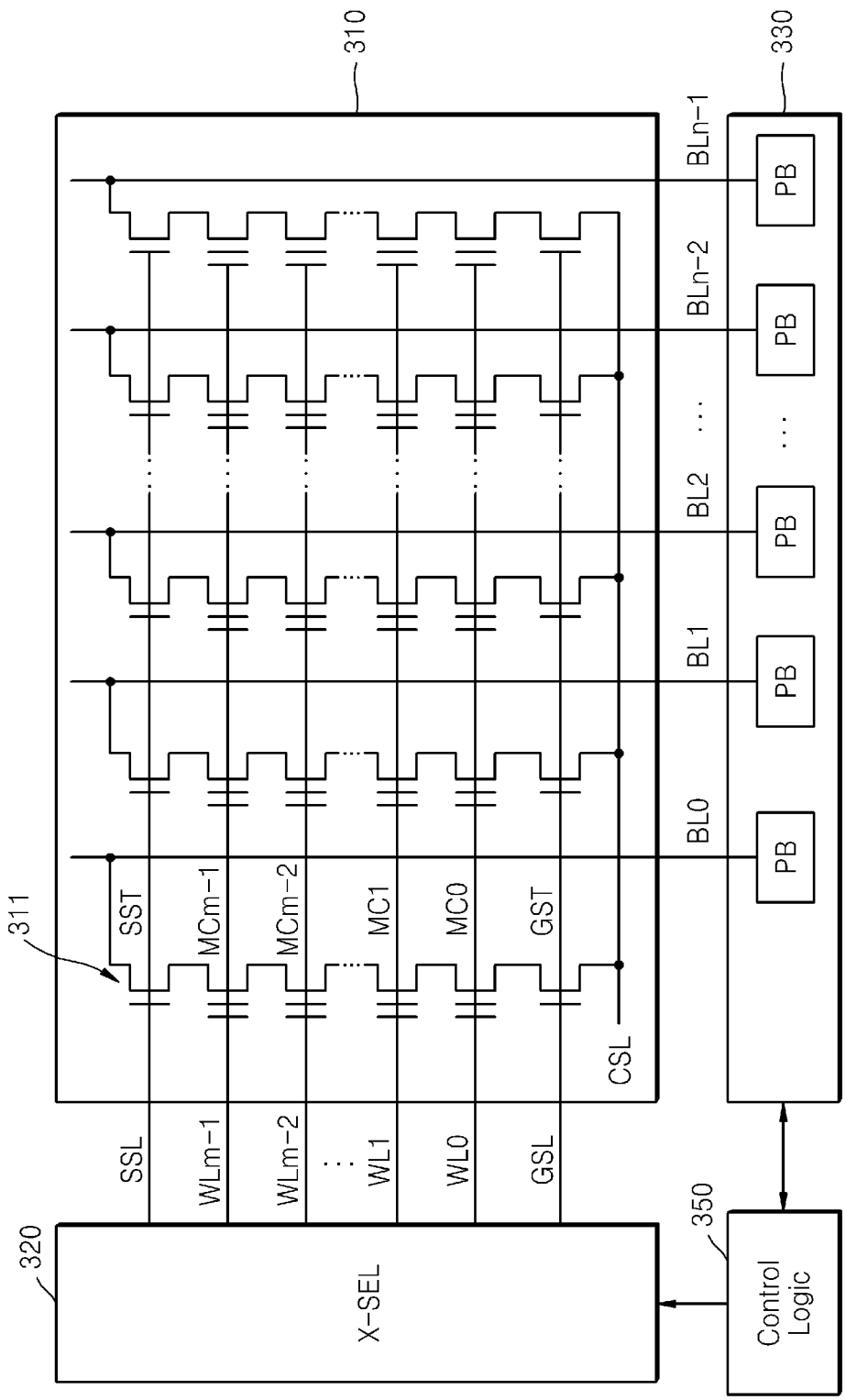
FIG. 4 is a diagram of a memory cell array illustrated in FIG. 3, according to an example embodiment of inventive concepts.

The memory cell array 310 may include a plurality of cell strings 311 (e.g., a plurality of NAND strings) connected to a plurality of bit lines BL0 to BLn−1, respectively, as illustrated in FIG. 4. Each of the plurality of cell strings 311 may include: a string selection transistor (SST) connected to a string selection line (SSL); a plurality of memory cells MC0 to MCm−1 connected to a plurality of word lines WL0 to WLm−1; and a ground selection transistor (GST) connected to a ground selection line (GSL). The SST is connected between a bit line and a string channel, and the GST is connected between the string channel and a common source line (CSL). The cell strings 311 are electrically connected to the bit lines BL0 to BLn−1, respectively.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory cell array 310 may store typical user data or main data, and may also store metadata (e.g., mapping information based on a flash transition layer (FTL)), which is used for the driving of the flash memory 300, other than the typical user data. The FTL allows the flash memory 300 to be utilized more efficiently. The FTL converts logical addresses provided from the processor 210 into physical addresses that may be used in a flash memory.

A success rate of an HD decoding stage and a success rate of an SD decoding stage, which are obtained as a result of a read operation during a test process after a manufacturing process of the flash memory 310, may be stored in the memory cell array 310. In addition, a success rate of the HD decoding stage and a success rate of the SD decoding stage, which are obtained as a result of a read operation during the use of the flash memory 300, may be stored in the memory cell array 310.

The page buffer 330 is connected to the memory cell array 310 via the plurality of bit lines BL0 to BLn−1. The page buffer 330 may operate as a write driver for temporarily storing data to be written in memory cells connected to a selected word line, or may operate as a sense amplifier for sensing and amplifying data read from memory cells connected to a selected word line.

The control logic 350 may control overall operations related to a program operation, a read operation, and an erase operation of the flash memory 300. The voltage generation circuit 360 may generate word line voltages (e.g., a program voltage Vpgm, a read voltage Vread, and/or a pass voltage Vpass) to be supplied to word lines according to an operation mode, and a voltage to be supplied to a bulk (e.g., a well region) in which memory cells were formed. A voltage generation operation of the voltage generation circuit 360 may be controlled by the control logic 350. The read voltage Vread of the word line voltages generated by the voltage generation circuit 360 may be used as a reference read voltage.

The X-SEL 320 may select one of a plurality of memory blocks (or sectors) of the memory cell array 310 in response to control of the control logic 350, and may select one of a plurality of word lines of the selected memory block. Also, the X-SEL 320 may provide the selected word line and unselected word lines with the word line voltages generated by the voltage generation circuit 360, in response to control of the control logic 320.

The Y-SEL 340 may output data read from the page buffer circuit 330 to the outside (e.g., the memory controller 200 or the host) in response to column address information Y-addr during a read operation.

Figure 5:
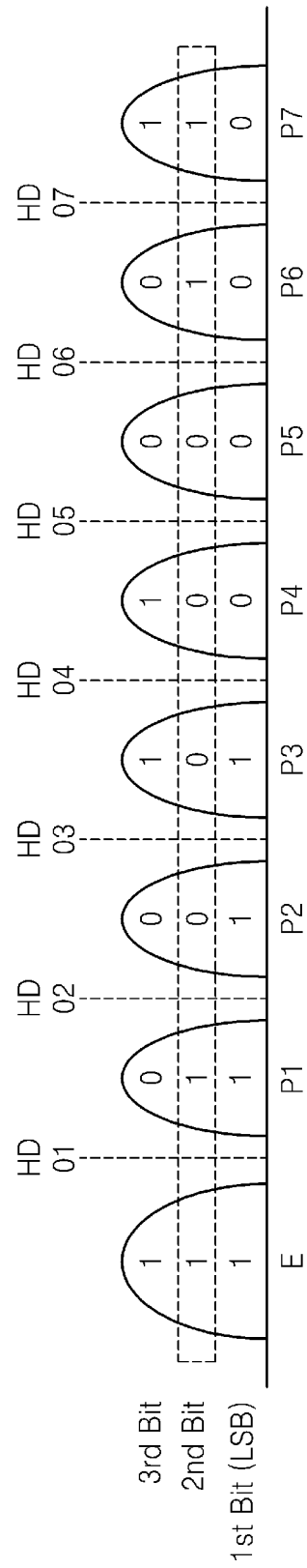

FIGS. 5, 6A, and 6B are diagrams showing an example threshold voltage distribution formed in a memory cell of a multi-bit flash memory by a program operation.

Referring to FIG. 5, a threshold voltage of a memory cell in which multi-bit data (e.g., 3-bit data) was programmed may correspond to any one of data states E and P1 to P7 of eight levels. Each of the data states E and P1 to P7 may form a threshold voltage window. One memory cell may store 3-bit data, and each bit may be independently programmed through several steps of the program operation. For example, in a 3-bit MLC, a program for a first bit (e.g., a least significant bit (LSB)) among the 3 bits may be performed first. Then, a program for a second bit and a program for a third bit may be sequentially performed.

In ideal data states of a programmed MLC, a given (or alternatively, desired or predetermined) voltage interval is maintained between adjacent data states so that a read margin may be sufficiently secured. However, in the actual implementation of a multi-bit flash memory, a threshold voltage distribution of each data state may change from a part indicated by a solid line to a part indicated by a dashed line, as shown in FIGS. 6A and 6B.

FIG. 6A shows a threshold voltage distribution (indicated by a dashed line) spread out at a low voltage side compared to an initial threshold voltage distribution (indicated by a solid line), and FIG. 6B shows a threshold voltage distribution (indicated by a dashed line) spread out at a high voltage side, compared to an initial threshold voltage distribution (indicated by a solid line). Such a phenomenon may be more severe when the number of data bits stored in one memory cell increases. Furthermore, this phenomenon may become more prevalent as a result of, for example, severe charge loss, elapse of time, increase in temperature, coupling occurring when programming adjacent cells, reading of adjacent cells, and/or cell defects. Read errors occurring due to these phenomena causes may be solved through a reading method using decoding methods based on the threshold voltage distribution of a flash memory.

Figure 7:
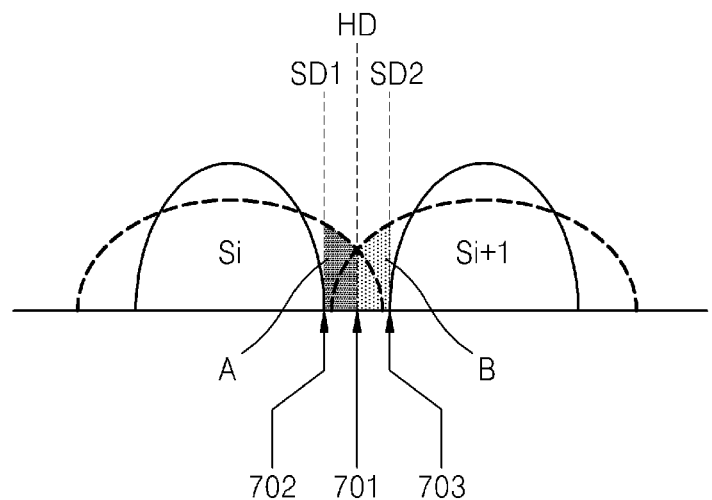
FIG. 7 is a diagram showing adjacent data states to explain flash memory reading methods according to various example embodiments of inventive concepts.

FIG. 7 is a diagram showing adjacent data states to explain flash memory reading methods according to various example embodiments of inventive concepts.

Referring to FIG. 7, in data states programmed in a memory cell, a given (or alternatively, desired or predetermined) voltage interval is maintained between adjacent data states Si and Si+1 so that a read margin may be sufficiently secured. A reference read voltage may be set based on ideal data states. Ideal data states Si and Si+1 indicated by a solid line may be distinguished by a reference read voltage indicated by the numeral 701. A read operation that is performed by using the reference read voltage 701 is referred to as an HD read operation. Thus, the reference read voltage 701 may be referred to as an HD read voltage.

However, each of the ideal data states Si and Si+1 may change to a non-ideal data state as indicated by a dashed line. If the ideal data states Si and Si+1 indicated by the solid line change to non-ideal data states as indicated by the dashed line, it is relatively difficult to distinguish changed data states (e.g., the non-ideal data states) using only the HD read operation. In this case, the distinction of the changed data states (e.g., the non-ideal data states) may be performed through an SD read operation. Reliable data obtained by the SD read operation in addition to HD data may be provided to the ECC 230, and thus, may be used for correcting errors resulting from the changed data states (e.g., the non-ideal data states). The SD read operation may be performed by using a first SD read voltage indicated by the numeral 702 at a low voltage side and a second SD read voltage indicated by the numeral 703 at a high voltage side.

In at least some example embodiments of inventive concepts, a reading method using the number of cells having a threshold voltage between the reference read voltage 701, which is a HD read voltage and the first SD read voltage 702 at the low voltage side of the HD read voltage 701 and the number of cells having a threshold voltage between the HD read voltage 701 and the second SD read voltage 703 at the high voltage side of the HD read voltage 701 may be used to perform more accurate data determination and error correction.

In the changed data states (e.g., the non-ideal data states), as indicated by a dashed line, it is assumed that the number of cells having a threshold voltage, which is higher than the first SD read voltage 702 and is lower than the HD read voltage 701, is "A" and the number of cells having a threshold voltage that is higher than the HD read voltage 701 and is lower than the second SD read voltage 703 is "B". In at least some example embodiments of inventive concepts, the maximum number of iterations in the SD and/or HD decoding operation may be changed based on "A" and "B".

Figure 9:
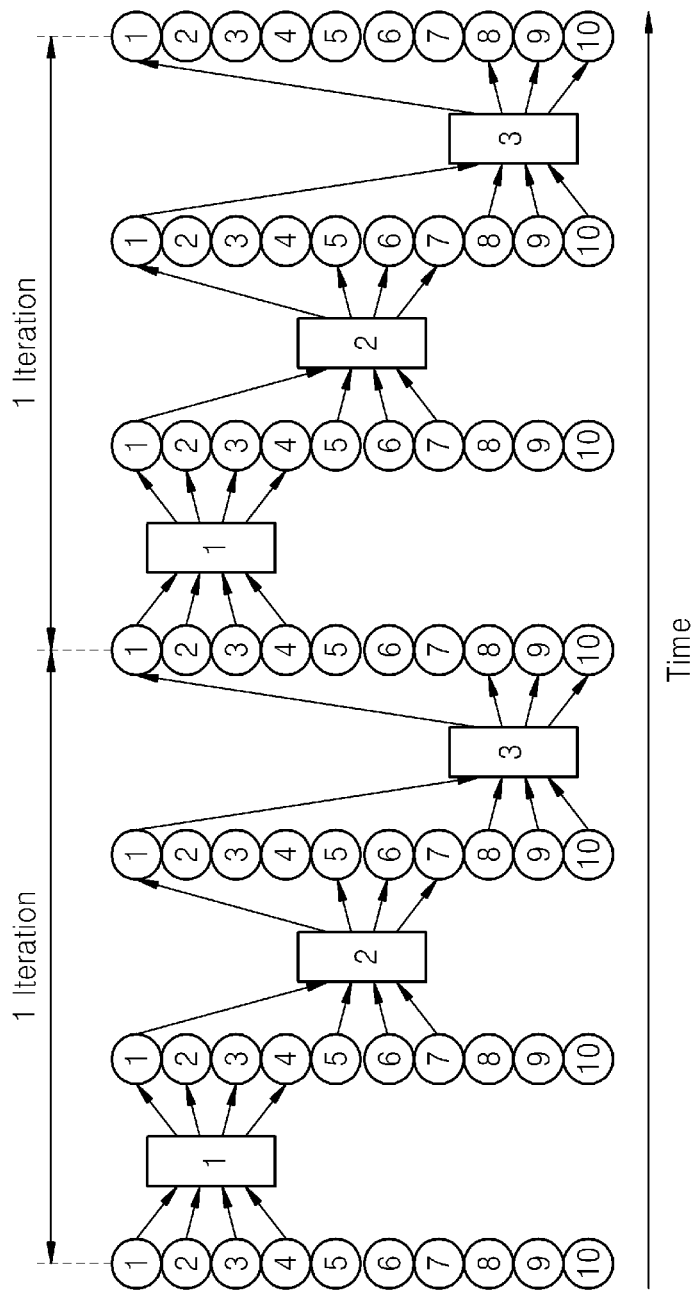

FIGS. 8 and 9 are diagrams for explaining a LDPC decoding method usable in flash memory reading methods according to one or more example embodiments of inventive concepts.

Referring to FIG. 8, a LDPC decoding may be performed by using a bipartite graph that is referred to as a Tanner graph. The Tanner graph may include variable nodes and check nodes. The variable nodes correspond to data bits (also referred to as a codeword) read from a flash memory, and the check nodes correspond to parity-check constraints between the variable nodes to which the check nodes are connected. The LDPC decoding is performed by transmitting and receiving messages to and from the Tanner graph and using a sum product algorithm (SPA). One round of message exchanges between the variable nodes and the check nodes is referred to as "one iteration".

As illustrated in FIG. 9, a plurality of iterations (or iteration processes) are used to obtain sufficient decoding characteristics. Through the plurality of iterations, received data bits may be estimated according to results of the calculation of a message from a variable node to a check node from among messages transmitted and received between the variable and check nodes and the calculation of a message from a check node to a variable node from among the messages.

However, in LDPC decoding, a time required for a message calculation in each and every iteration may influence decoding time. In particular, when it is difficult to correctly identify a data state that the threshold voltage distribution of a memory cell is in during a data reading, performing a message calculation according to a plurality of iterations may increase LDPC decoding time. Accordingly, decoding efficiency may be lowered.

In flash memory reading methods according to at least some example embodiments of inventive concepts, which will be described in more detail later, the maximum number of iterations of SD decoding is decreased when a threshold voltage of a memory cell is shifted, and a probability of error correction is relatively low, and the maximum number of iterations of the SD decoding is increased when the probability of error correction is relatively high. In addition, when error correction probability is relatively low, the maximum number of iterations of the HD decoding and the maximum number of iterations of the SD decoding are decreased to reduce an HD decoding time and an SD decoding time. When the error correction probability is relatively high, the maximum number of iterations of the HD decoding and the maximum number of iterations of the SD decoding are increased. Through such flash memory reading methods, a decoding time in an error correction operation may be reduced and/or decoding efficiency may be improved.

Figure 10A:
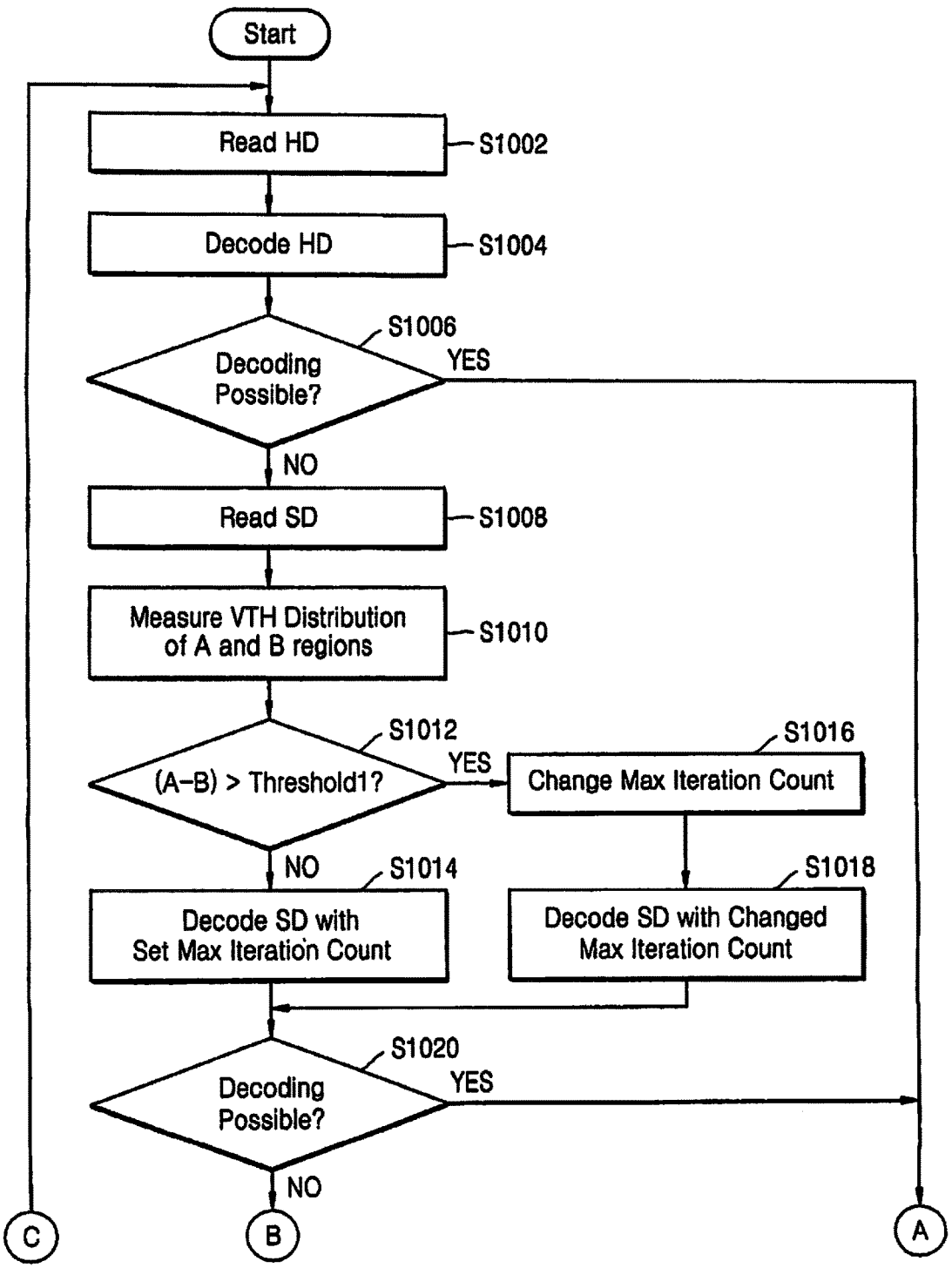
FIGS. 10A and 10B show a flowchart illustrating a flash memory reading method according to an example embodiment of inventive concepts.
Figure 10B:
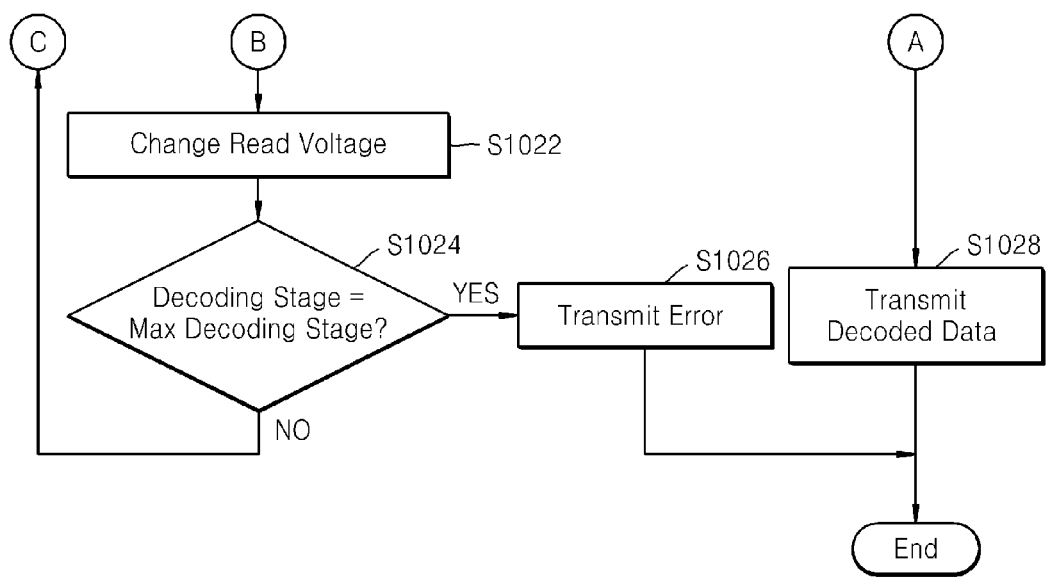

FIGS. 10A and 10B show a flowchart illustrating a flash memory reading method according to an example embodiment of inventive concepts. For example purposes, the method shown in FIGS. 10A and 10B will be described with regard to the ECC 230 shown in FIGS. 1 and 2.

Referring to FIGS. 10A and 10B, at operation S1002 the ECC 230 performs an HD read operation on data read from the flash memory 300 of FIG. 1. The ECC 230 applies an HD read voltage Vread to perform the HD read operation. For example, seven read voltages HD01 to HD07 are applied to a memory cell storing 3-bit data as shown in FIG. 5. In this example, the number of HD read voltages for reading data of a memory cell storing N-bit data (where N is a natural number that is greater than or equal to 2) is $(2^N-1)$.

At operation S1004, the ECC 230 performs HD decoding on HD data read by using the HD read voltage Vread.

At operation S1006, if the ECC 230 determines that the HD decoding may be performed (e.g., the HD decoding is successful), then the ECC 230 transmits HD decoded data to a host at operation S1028.

Returning to operation S1006, if the ECC 230 determines that the HD decoding may not be performed (e.g., the HD decoding is unsuccessful, see "NO" of Operation S1006), then the ECC 230 performs a SD read operation having a relatively high error correction capability at operation S1008. The ECC 230 applies a SD read voltage to perform the SD read operation. For example, as illustrated in FIG. 7, the first SD read voltage 702 at the low voltage side of the HD read voltage 701 and the second SD read voltage 703 at the high voltage side of the HD read voltage 701 are applied. The number of SD read voltages for reading 3-bit data is fourteen. The number of SD read voltages for reading N-bit data is $2\times(2^N-1)$. In at least one other example embodiment, the number of SD read voltages may be $4\times(2^N-1)$.

At operation S1010, in order to reduce SD decoding time, the ECC 230 measures the number ("A") of memory cells having a threshold voltage between the first SD read voltage 702 and the HD read voltage 701 and the number ("B") of memory cells having a threshold voltage between the HD read voltage 701 and the second SD read voltage 703.

At operation S1012, based on the measured result, the ECC 230 determines whether the number of memory cells corresponding to a difference (A–B) between the number ("A") of memory cells and the number ("B") of memory cells is greater than (or greater than or equal to) a first threshold THRESHOLD1. If the threshold voltage distribution of a memory cell is the same as that illustrated in FIG. 5, then the number of memory cells corresponding to the difference (A–B) will almost approach "0". However, if the threshold voltage distribution of a memory cell is shifted as shown in FIGS. 6A and 6B, then the number of memory cells corresponding to the difference (A–B) will change. If the number (A–B) of memory cells is greater than the first threshold THRESHOLD1, then it is estimated that an error correction probability will be relatively low. In addition, if repeated calculations of a SD decoding are performed according to the initial maximum number of iterations, which may be set in advance, it is estimated that a relatively long time will be needed for an error correction process.

Returning to FIGS. 10A and 10B, if the number of memory cells corresponding to the difference (A–B) is less than the first threshold THRESHOLD1 at operation S1012, then the ECC 230 performs SD decoding according to the initial maximum number of iterations at operation S1014. The maximum number of iterations may be set in advance (e.g., predetermined, or alternatively, given or desired).

Returning to operation S1012, if the number of memory cells corresponding to the difference (A–B) is greater than the first threshold THRESHOLD1, then the ECC 230 changes the maximum number of iterations at operation S1016, and performs the SD decoding according to the changed maximum number of iterations at operation S1018. The changed maximum number of iterations may be less than the initially set maximum number of iterations. In this example, the ECC 230 decreases the maximum number of iterations at operation S1016.

At operation s1020, if the ECC 230 determines that the SD decoding may be performed (e.g., the SD decoding is successful), then the ECC 230 transmits the SD decoded data to the host at operation S1028.

Returning to operation S1020, if the ECC 230 determines that the SD decoding may not be performed (e.g., the SD decoding is unsuccessful, see "NO" of Operation S1020), then the ECC 230 changes the HD read voltage Vread at operation s1022.

At operation s1024, the ECC 230 determines whether a corresponding HD decoding stage is a set maximum (or final) decoding stage.

If the corresponding HD decoding stage is the maximum decoding stage, then the ECC 230 transmits an error signal to the host at operation s1026 because the SD decoding may not be performed.

Returning to operation S1024, if the corresponding HD decoding stage is not the maximum decoding stage, then process returns to operation S1002 and the ECC 230 again performs the HD read operation using the changed HD read voltage Vread.

In a flash memory reading method according to at least this example embodiment of inventive concepts, when the threshold voltage distribution of a memory cell is shifted, and thus, error correction probability is relatively low, the maximum number of iterations of SD decoding is decreased to perform the SD decoding. Accordingly, a time needed for SD decoding may be reduced.

Figure 11A:
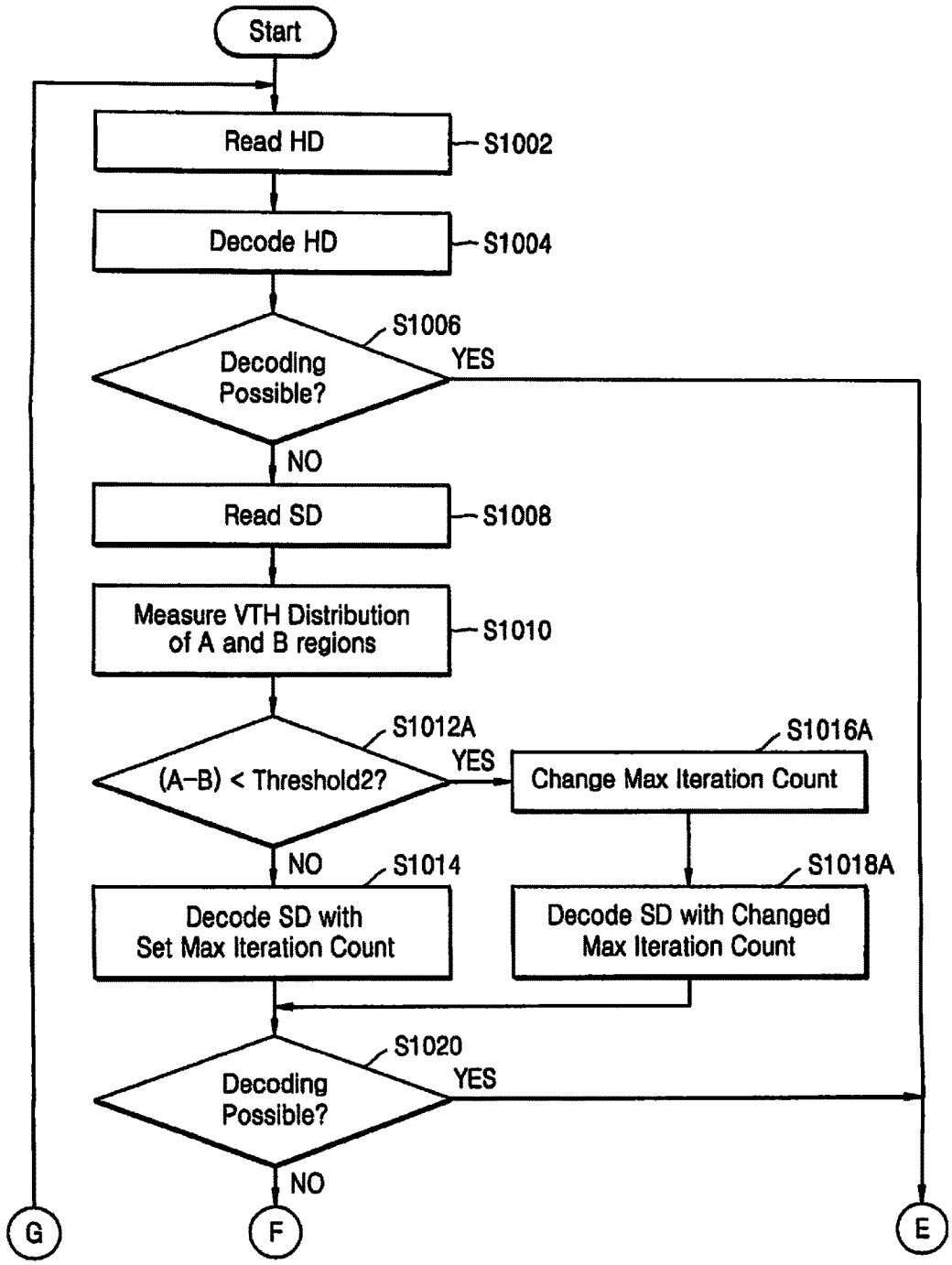
FIGS. 11A and 11B show a flowchart illustrating a flash memory reading method according to another example embodiment of inventive concepts.
Figure 11B:
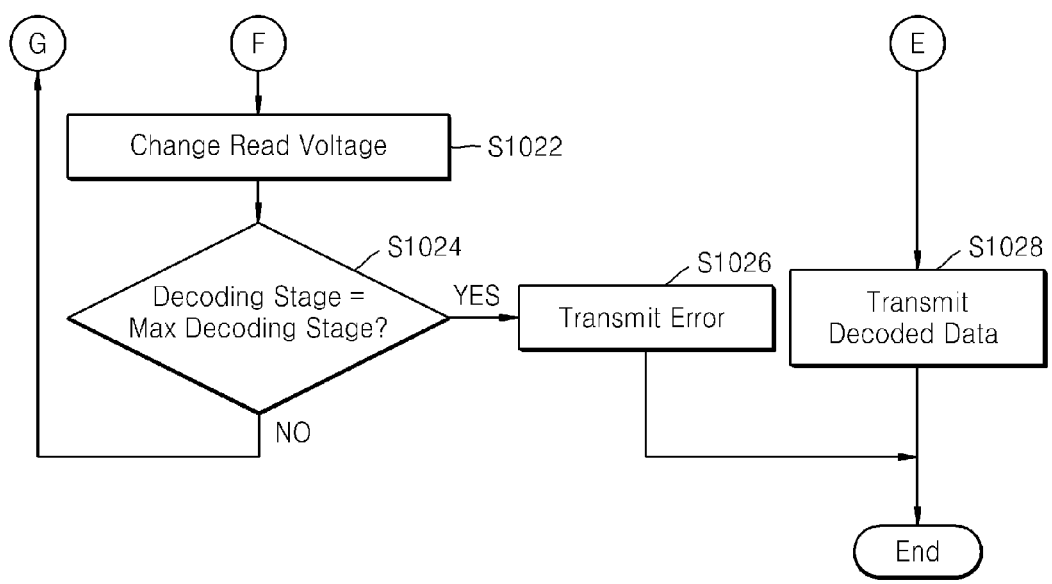

FIGS. 11A and 11B show a flowchart illustrating a flash memory reading method according to another example embodiment of inventive concepts. Since the flowchart of FIGS. 11A and 11B is substantially the same as the flowchart of FIGS. 10A and 10B, repeated descriptions of operations that are the same as those of the flowchart of FIGS. 10A and 10B are omitted and only differences are described. As with the example embodiment shown in FIGS. 10A and 10B, the example embodiment shown in FIGS. 11A and 11B will be described with regard to the ECC 230.

Referring to FIGS. 11A and 11B, at operation S1012A, based on the number ("A") of memory cells having a threshold voltage between the first SD read voltage 702 and the HD read voltage 701 and the number ("B") of memory cells having a threshold voltage between the HD read voltage 701 and the second SD read voltage 703, which are measured in Operation S1010, the ECC 230 determines whether the number of memory cells corresponding to a difference (A−B) between the number ("A") of memory cells and the number ("B") of memory cells is less than (or less than or equal to) a second threshold THRESHOLD2. If the number of memory cells corresponding to a difference A−B is less than the second threshold THRESHOLD2, it may be estimated that an error correction probability will be relatively high. Since the error correction probability is relatively high, an error included in read data may be corrected when repeated calculations of an SD decoding are performed according to the number of iterations that is greater than the initial maximum number of iterations, which may be set in advance. In this case, an error correction operation having relatively high accuracy is performed, thereby improving SD decoding efficiency.

Based on the measured result (see Operation S1010), if the number of memory cells corresponding to the difference (A−B) is less than the second threshold THRESHOLD2 at operation S1012A, then the ECC 230 changes the maximum number of iterations at operation S1016A, and performs the SD decoding according to the changed maximum number of iterations at operation S1018A. The changed maximum number of iterations may be greater than the maximum number of iterations, which is set in advance. In this example, the ECC 230 increases the maximum number of iterations at operation S1016A.

In the flash memory reading method according to at least this example embodiment of inventive concepts, when the threshold voltage distribution of a memory cell is shifted, and thus, error correction probability is relatively high, the maximum number of iterations of the SD decoding is increased to perform the SD decoding. Accordingly, SD decoding efficiency may be improved.

Figure 12A:
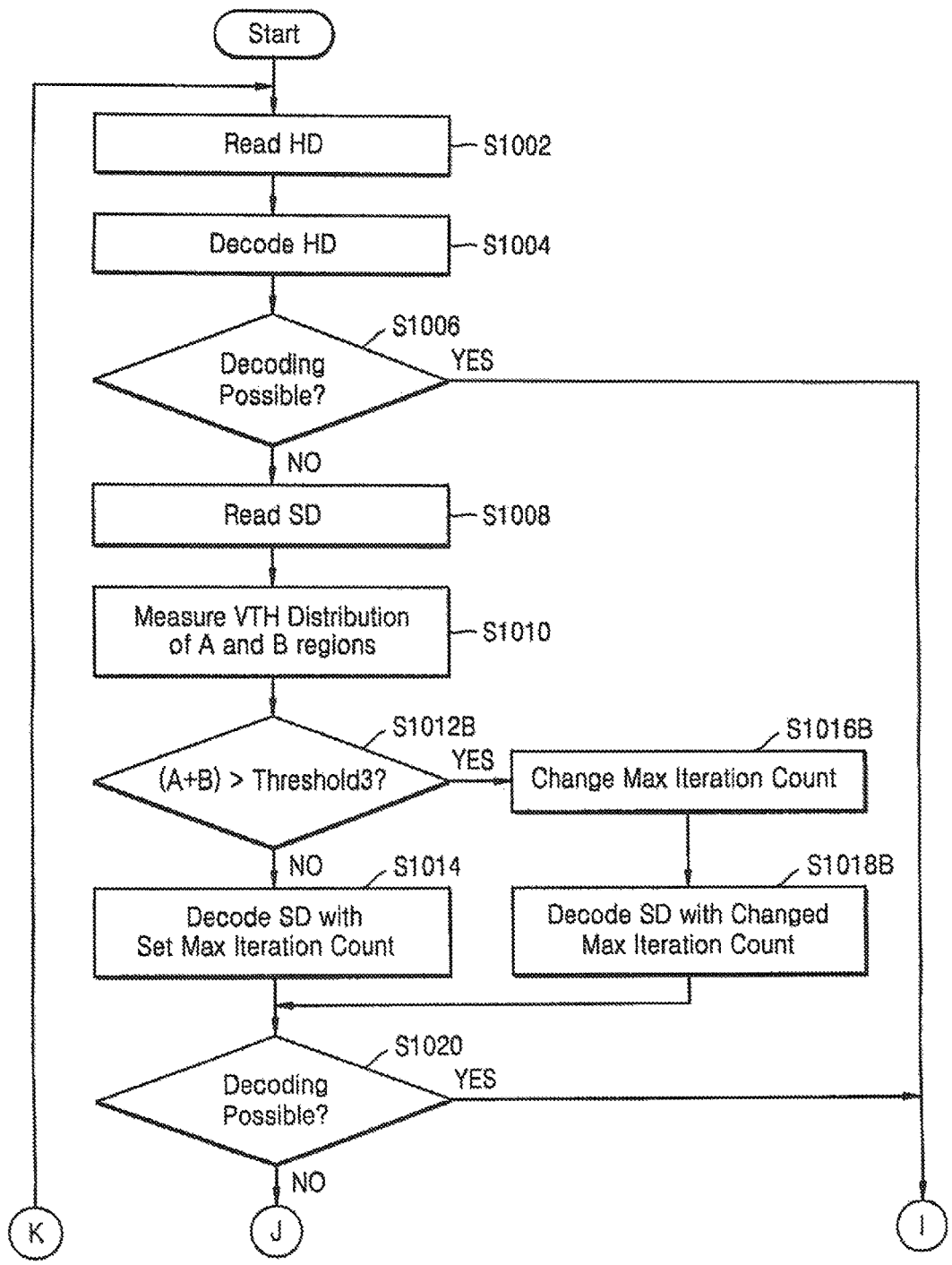
FIGS. 12A and 12B show a flowchart illustrating a flash memory reading method according to yet another example embodiment of inventive concepts.
Figure 12B:
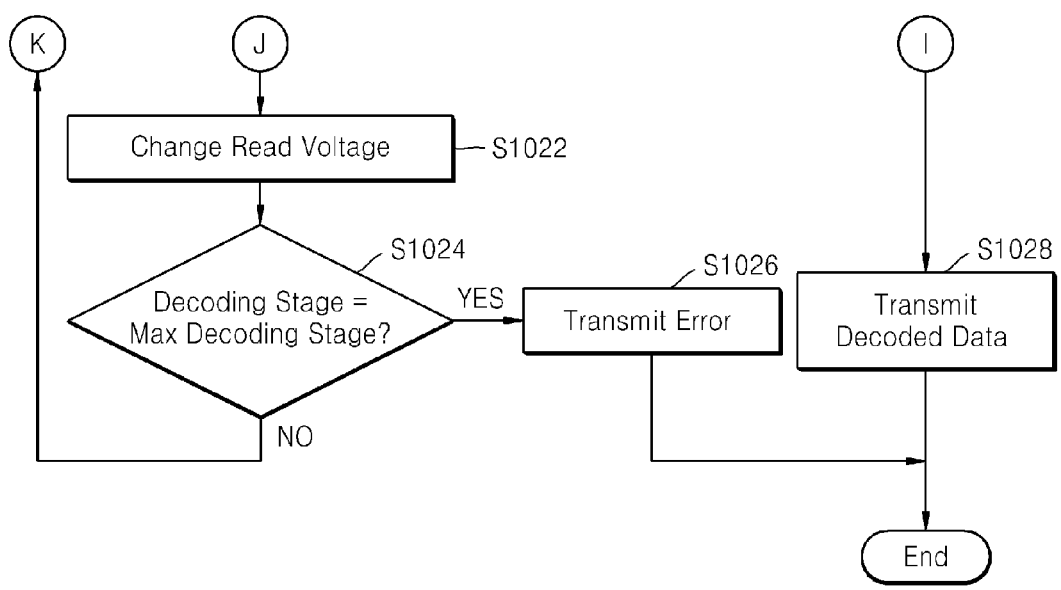

FIGS. 12A and 12B show a flowchart illustrating a flash memory reading method according to another example embodiment of inventive concepts. Since the flowchart of FIGS. 12A and 12B is substantially the same as the flowchart of FIGS. 10A and 10B, repeated descriptions of operations that are the same as those of the flowchart of FIGS. 10A and 10B are omitted and only differences are described. As with other example embodiments, the example embodiment shown in FIGS. 12A and 12B will be described with regard to the ECC 230.

Referring to FIGS. 12A and 12B, at operation S1012B, based on the number ("A") of memory cells having a threshold voltage between the first SD read voltage 702 and the HD read voltage 701 and the number ("B") of memory cells having a threshold voltage between the HD read voltage 701 and the second SD read voltage 703, which are measured in Operation S1010, the ECC 230 determines whether the number of memory cells corresponding to the sum (A+B) of the number ("A") of memory cells and the number ("B") of memory cells is greater than (or greater than or equal to) a third threshold THRESHOLD3. If the number of memory cells corresponding to the sum (A+B) is greater than the third threshold THRESHOLD3, it may be estimated that an error correction probability will be relatively low. Since the error correction probability is relatively low, a relatively long time may be required for an error correction process if the error correction process is performed by an SD decoding in which repeated calculations are performed according to the initial maximum number of iterations, which may be set in advance.

Based on the measured result (see Operation S1010), if the number of memory cells corresponding to the sum (A+B) is greater than the third threshold THRESHOLD3 at operation S1012B, then the ECC 230 changes the maximum number of iterations at operation S1016B, and performs the SD decoding according to the changed maximum number of iterations at operation S1018B. The changed maximum number of iterations may be set less than the maximum number of iterations, which may be initially set in advance. In this example, the ECC 230 decreases the maximum number of iterations of the SD decoding.

In the flash memory reading method according to at least this example embodiment of inventive concepts, when the threshold voltage distribution of a memory cell is shifted, and thus, error correction probability is relatively low, the maximum number of iterations of the SD decoding is decreased to perform the SD decoding. Accordingly, a time needed for the SD decoding may be reduced.

Figure 13A:
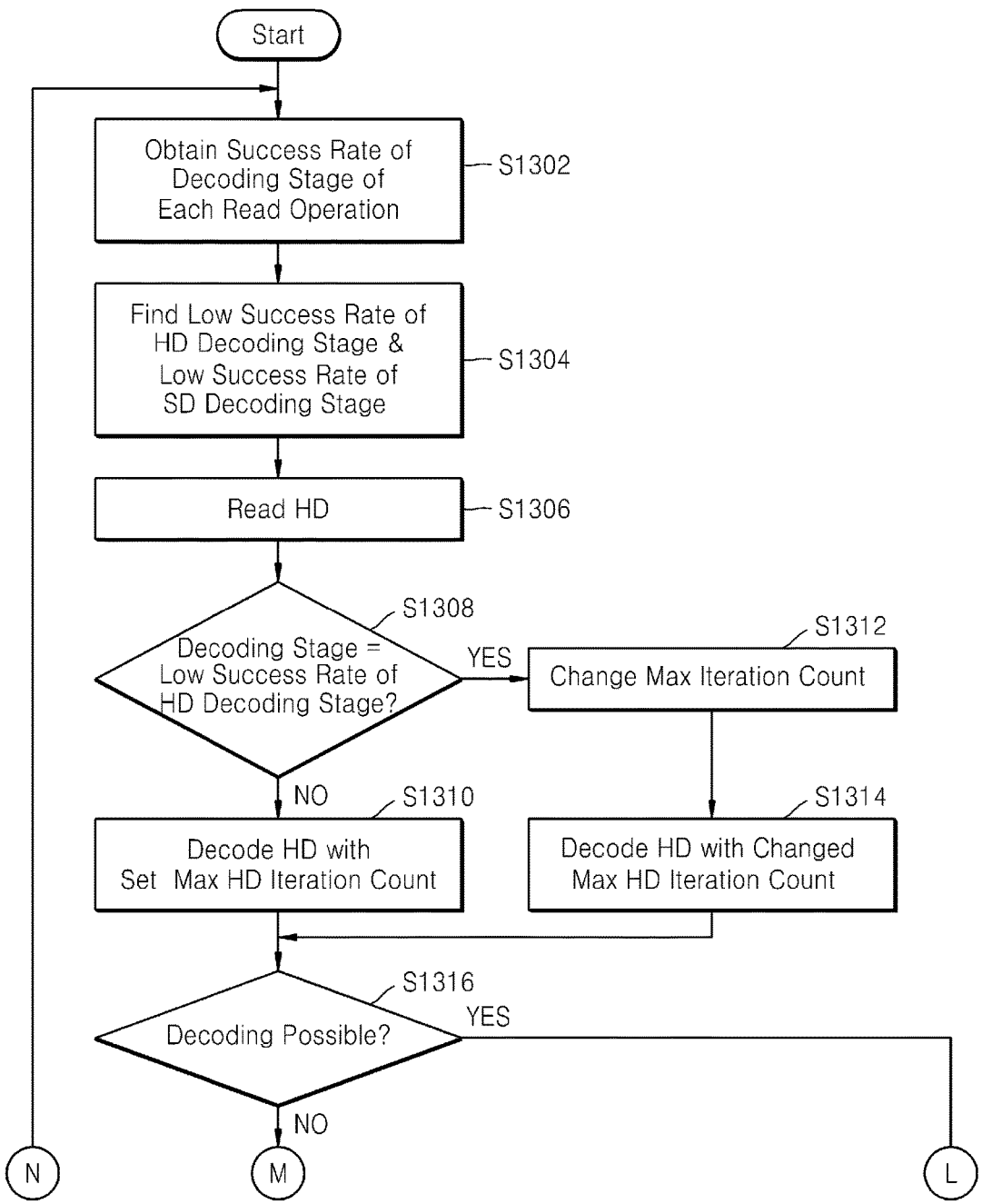
FIGS. 13A and 13B show a flowchart illustrating a flash memory reading method according to still another example embodiment of inventive concepts.
Figure 13B:
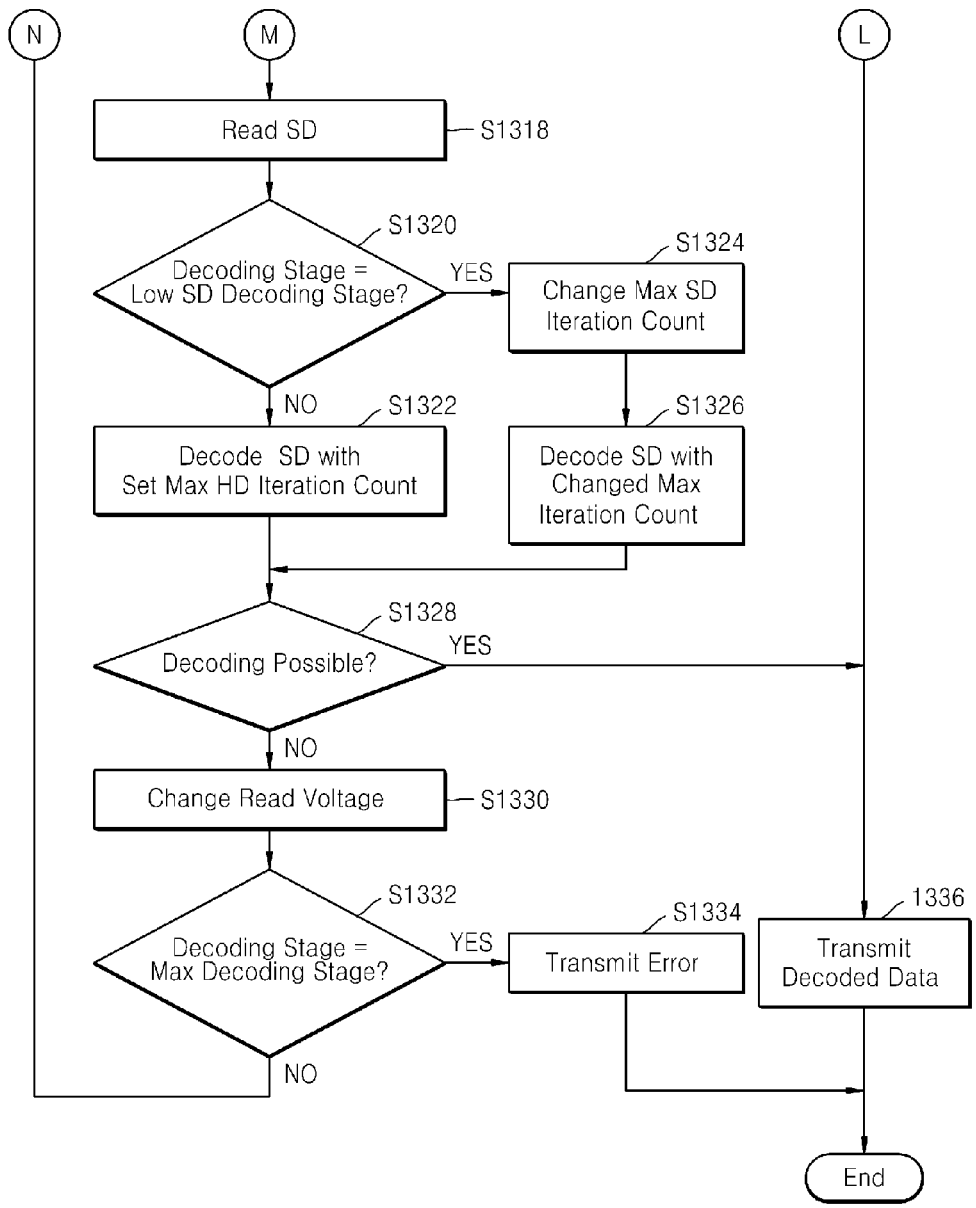

FIGS. 13A and 13B show a flowchart illustrating a flash memory reading method according to another example embodiment of inventive concepts. For example purposes, the example embodiment shown in FIGS. 13A and 13B will be described with regard to the ECC 230.

According to at least some example embodiments, an error included in read data may be corrected through a read operation of a flash memory that performs an HD read operation and an SD read operation.

Referring to FIGS. 13A and 13B, at operation S1302 the ECC 230 obtains a success rate of each HD decoding stage and a success rate of each SD decoding stage based on the read operation through which the error was corrected. A result of the read operation may be obtained in a test process after a manufacturing process of the flash memory or during the use of the flash memory. Also, the ECC 230 may obtain a result of the read operation through any one of the flash memory reading methods described with reference to FIGS. 10A to 12B.

The ECC 230 may store the success rate of each HD decoding stage and the success rate of each SD decoding stage, which are obtained as a result of the read operation, in the flash memory (e.g., the flash memory 300 of FIG. 3). The success rate of each HD decoding stage and the success rate of each SD decoding stage may be stored in an area allocated as a user area in the memory cell array 310 of the flash memory 300. The decoder 234 of the error correction circuit 230 in the memory controller 200 of FIG. 2 may fetch success rates of HD decoding stages and success rates of SD decoding stages, stored in the flash memory 300.

At operation S1304, the ECC 230 searches for an HD decoding stage having the lowest (or minimum) success rate from among the success rates of the HD decoding stages, and an SD decoding stage having the lowest success rate from among the success rates of the SD decoding stages. The error correction probability of an HD decoding stage having a relatively low success rate is relatively low. Since the error correction probability is relatively low, a relatively long time may be needed for an error correction process if the HD decoding is performed according to the initial maximum number of iterations of the HD decoding. The maximum number of iterations of the HD decoding may be set in advance (e.g., given or alternatively desired or predetermined). Similarly, since an SD decoding stage having a relatively low success rate has a relatively low error correction probability, a relatively long time may be needed for an error correction process if the SD decoding is performed according to the initial maximum number of iterations of the SD decoding. The maximum number of iterations of the SD decoding may also be set in advance (e.g., given or alternatively desired or predetermined).

At operation S1306, the ECC 230 performs a HD read operation on data read from the flash memory 300. The ECC 230 applies a HD read voltage Vread to perform the HD read operation.

At operation S1308, the ECC 230 determines whether a corresponding HD decoding stage is an HD decoding stage having the lowest (or minimum) success rate.

At operation S1310, if the ECC 230 determines that the corresponding HD decoding stage is not a HD decoding stage having the lowest success rate, then the ECC 230 performs the HD decoding according to the initial maximum number of iterations of the HD decoding. The maximum number of iterations of the HD decoding may be set in advance (e.g., given, or alternatively desired or predetermined).

Returning to operation S1308, if the ECC 230 determines that the corresponding HD decoding stage is an HD decoding stage having the lowest success rate, then the ECC 230 changes the maximum number of iterations of the HD decoding at operation S1312, and performs the HD decoding according to the changed maximum number of iterations at operation S1314. The changed maximum number of iterations may be set less than the maximum number of iterations. In this example, the ECC 230 decreases the maximum number of iterations of the HD decoding at operation S1312.

At operation S1316, if the ECC 230 determines that the HD decoding may be performed (e.g., the HD decoding is successful), then the ECC 230 transmits the HD decoded data to a host at operation S1336.

Returning to operation S1316, if the ECC 230 determines that the HD decoding may not be performed (e.g., the HD decoding is unsuccessful, see "NO" of Operation S1316), then the ECC 230 performs an SD read operation having higher error correction capability at operation S1318. An SD read voltage is applied to perform the SD read operation.

At operation S1320, the ECC 230 determines whether a corresponding SD decoding stage is a SD decoding stage having the lowest (or minimum) success rate.

If the ECC 230 determines that the corresponding SD decoding stage is not an SD decoding stage having the lowest success rate, then the ECC 230 performs the SD decoding according to the initial maximum number of iterations of the SD decoding at operation S1322. The maximum number of iterations of the SD decoding may be set in advance (e.g., given, or alternatively, desired or predetermined).

Returning to operation S1320, if the ECC 230 determines that the corresponding SD decoding stage is an SD decoding stage having the lowest success rate, then the ECC 230 changes the maximum number of iterations of the SD decoding at operation S1324, and performs the SD decoding according to the changed maximum number of iterations at operation S1326. The changed maximum number of iterations may be set less than the initial maximum number of iterations, which may be set in advance. In this example, the ECC 230 decreases the maximum number of iterations of the SD decoding at operation S1324.

At operation S1328, if the ECC 230 determines that the SD decoding may be performed (e.g., the SD decoding is successful), then the ECC 230 transmits the SD decoded data to the host at operation S1336.

Returning to operation S1328, if the ECC 230 determines that the SD decoding may not be performed (e.g., the SD decoding is unsuccessful, see "NO" of Operation S1328), then the ECC 230 changes the HD read voltage Vread at operation S1330.

At operation S1332, the ECC 230 determines whether a corresponding decoding stage is a set maximum decoding stage.

If the corresponding decoding stage is the maximum decoding stage, then the ECC 230 transmits an error signal to the host because the SD decoding may not be performed (see Operation S1334).

Returning to operation S1332, if the corresponding decoding stage is not the maximum decoding stage, then the ECC 230 returns to operation S1306, and continues as discussed above using the changed HD read voltage Vread.

In the flash memory reading method according to at least this example embodiment of inventive concepts, when an error correction probability is relatively low, the maximum number of iterations of the HD decoding and the maximum number of iterations of the SD decoding are decreased to perform the HD decoding and the SD decoding. Accordingly, a time needed for the HD decoding and the SD decoding may be reduced.

Figure 14A:
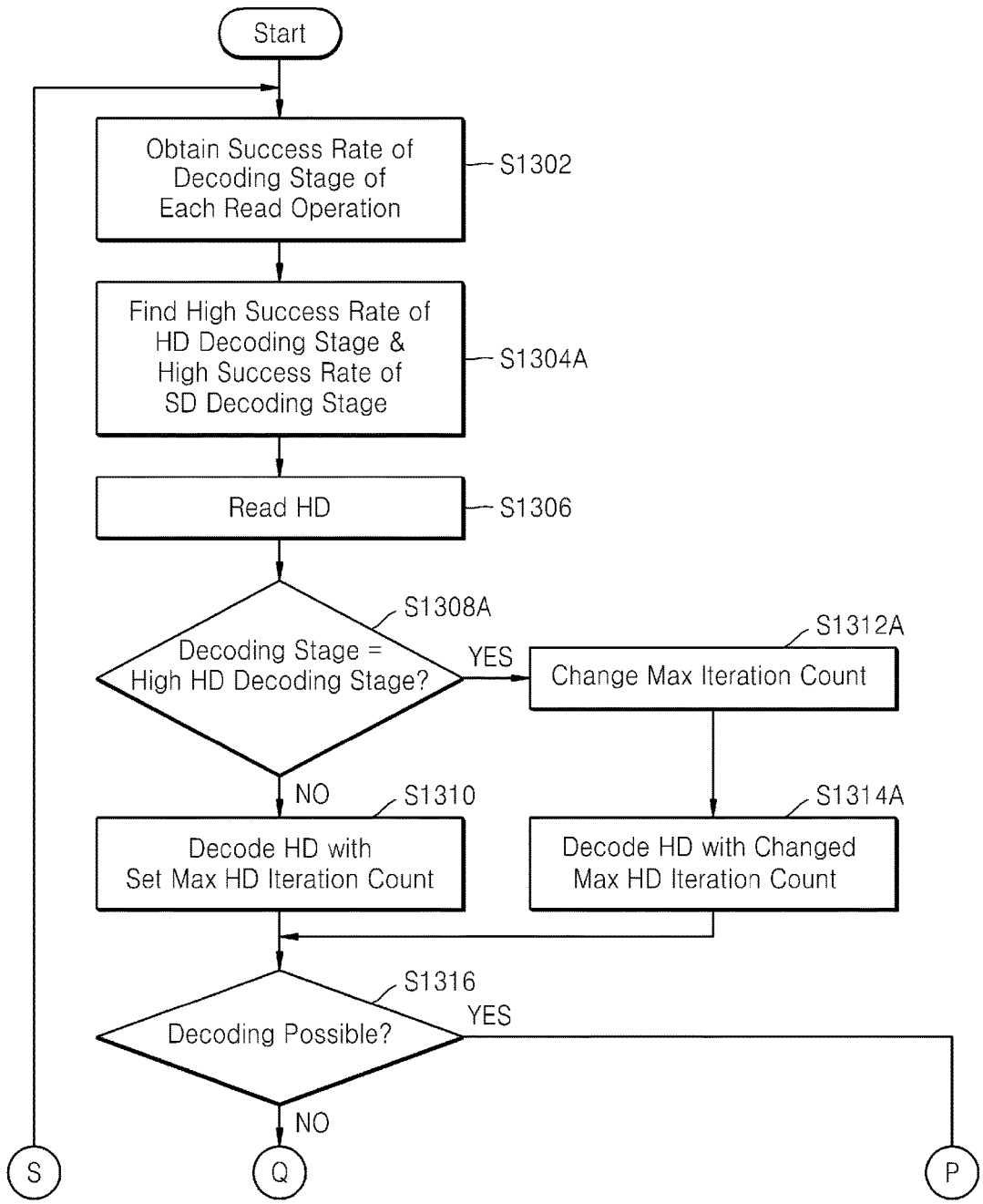
FIGS. 14A and 14B show a flowchart illustrating a flash memory reading method according to another example embodiment of inventive concepts.
Figure 14B:
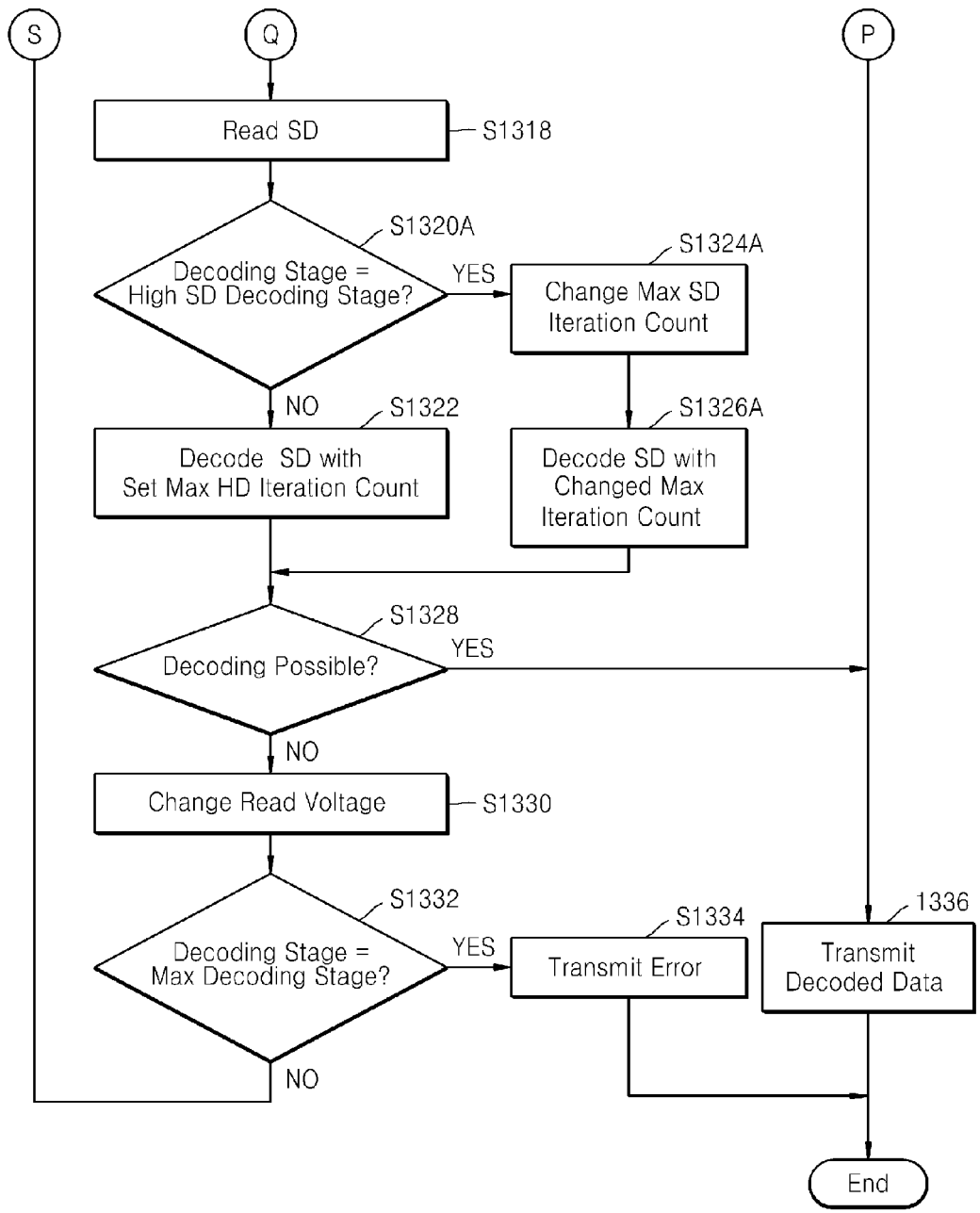

FIGS. 14A and 14B show a flowchart illustrating a flash memory reading method according to another example embodiment of inventive concepts. Since the flowchart of FIGS. 14A and 14B is substantially the same as the flowchart of FIGS. 13A and 13B, repeated descriptions of operations that are the same as those of the flowchart of FIGS. 13A and 13B are omitted and only differences are described. The flow chart shown in FIGS. 14A and 14B will be described with regard to the ECC 230.

Referring to FIGS. 14A and 14B, the ECC 230 obtains success rates of HD decoding stages and success rates of SD decoding stages from the flash memory 300. At operation S1304A, the ECC 230 searches for a HD decoding stage having the highest (or maximum) success rate from among the success rates of the HD decoding stages, and a SD decoding stage having the highest success rate from among the success rates of the SD decoding stages. The error correction probability of an HD decoding stage having a relatively high success rate is relatively high. Since the error correction probability is relatively high, an error included in read data may be corrected when repeated calculations of an HD decoding are performed according to the number of iterations that is greater than the initial maximum number of iterations, which may be set in advance. In this case, an error correction operation having relatively high accuracy is performed, thereby improving HD decoding efficiency.

At operation S1308A, the ECC 230 determines whether a corresponding HD decoding stage is a HD decoding stage having the highest success rate.

If the ECC 230 determines that the corresponding HD decoding stage is a HD decoding stage having the highest success rate, then the ECC 230 changes the maximum number of iterations of the HD decoding at operation S1312A, and performs the HD decoding according to the changed maximum number of iterations at operation S1314A. The changed maximum number of iterations may be set greater than the initial maximum number of iterations. In this example, the ECC 230 increases the maximum number of iterations of the HD decoding at operation S1312A.

At operation S1320A, the ECC 230 determines whether a corresponding SD decoding stage is a SD decoding stage having the highest success rate.

If the ECC 230 determines that the corresponding SD decoding stage is a SD decoding stage having the highest success rate, then the ECC 230 changes the maximum number of iterations of the SD decoding at operation S1324A, and performs the SD decoding according to the changed maximum number of iterations at operation S1326A. The changed maximum number of iterations may be set greater than the initial maximum number of iterations. In this example, the ECC 230 increases the maximum number of iterations at operation S1324A.

In the flash memory reading method according to at least this example embodiment of inventive concepts, when an error correction probability is relatively high, the maximum number of iterations of the HD decoding and the maximum number of iterations of the SD decoding are increased to perform the HD decoding and the SD decoding. Accordingly, HD decoding efficiency and SD decoding efficiency may be improved.

Although an initial maximum number of iterations is discussed herein as being initially set in advance (e.g., predetermined, or alternatively given or desired), it should be understood that the "initial maximum number of iterations" may refer to an initially set maximum number of iterations or a current (or set) maximum number of iterations, for example, depending on the particular stage of a given decoding process (e.g., HD decoding process).

Figure 15:
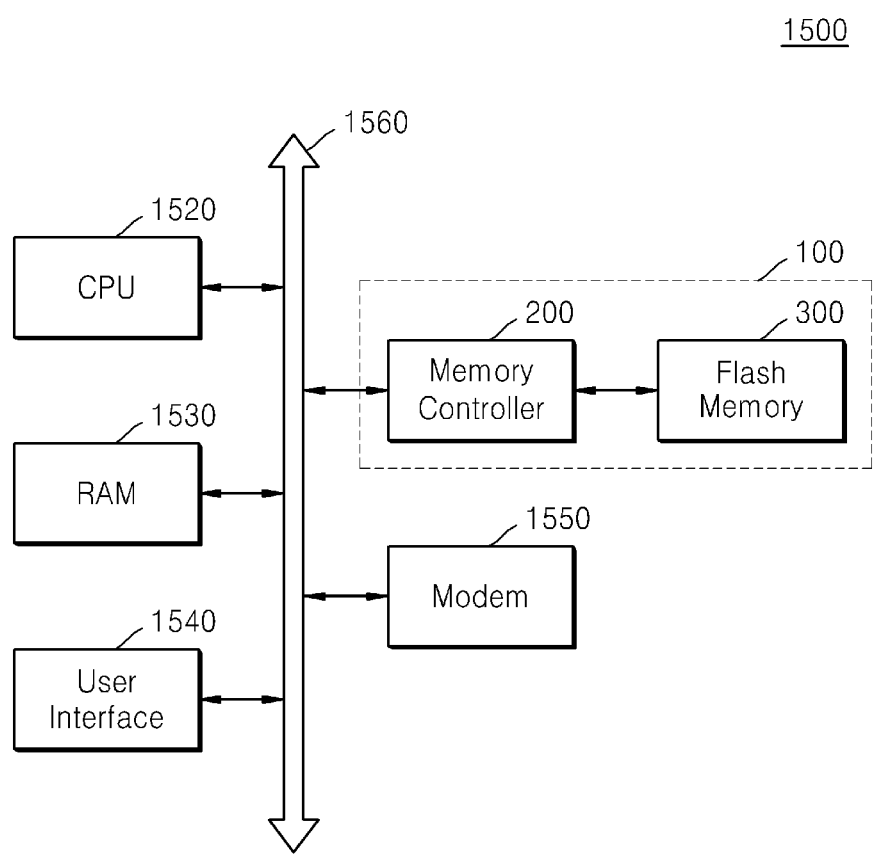
FIG. 15 is a block diagram of a computing system using flash memory reading methods according to various example embodiments of inventive concepts.

FIG. 15 is a block diagram of a computing system 1500 using a flash memory reading method according to one or more example embodiments of inventive concepts.

Referring to FIG. 15, the computing system 1500 may include: a central processing unit (CPU) 1520; random access memory (RAM) 1530; a user interface 1540; a modem 1550 such as a baseband chipset; and a memory system 100. The CPU 1520, the RAM 1530, the user interface 1540, the modem 1550 and the memory system 100 are connected to a system bus 1560.

The memory system 100 may include a memory controller 200 and a flash memory 300. The memory controller 200 may connect the CPU 1520 and the flash memory 300 via the system bus 1560. The memory controller 200 may provide an interface with the flash memory 300 to correspond to a bus format of the CPU 1520. The memory system 100 may constitute a solid state disk (SSD). In this case, the memory controller 200 may be configured to communicate with the outside (e.g., a host) via one of various interface protocols, such as USB, MMC, PCI-E, SAS, SATA, PATA, SCSI, ESDI, and IDE.

The memory controller 200 may be configured to be the same or substantially the same as the memory controller 200 illustrated in FIG. 2. Also, the memory controller 200 may use the flash memory reading methods according to one or more of the above-described example embodiments of inventive concepts. The memory controller 300 may be configured to be the same or substantially the same as the flash memory 300 illustrated in FIGS. 3 and 4.

The memory controller 200 uses the flash memory reading method(s) to read multi-bit data stored in a memory cell of the flash memory 300. The flash memory reading method may include performing (or attempting to perform) an HD decoding on read data output from the flash memory and performing a SD decoding on the read data when the HD decoding may not be performed (or is unsuccessful). The performing of the SD decoding may be performed by changing the number of maximum iterations of an LDPC decoding according to the threshold voltage distribution of memory cells. In addition, the performing of the HD decoding and the performing of the SD decoding may be performed by changing the number of maximum iterations of the HD decoding and the number of maximum iterations of the SD decoding according to a success rate of an HD decoding stage and a success rate of an SD decoding stage, respectively.

When the computing system 1500 is a mobile device, the computing system 1500 may additionally include a battery for supplying an operating voltage of the computing system 1500. Also, the computing system 1500 may further include: an application chipset; a camera image processor (CIS); mobile DRAM; and the like.

The memory controller 200 and/or the flash memory 300 according to at least this example embodiment of inventive concepts may be embedded using various types of packages. For example, the memory controller 200 and/or the flash memory 300 may be embedded using packages, such as package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), a small outline integrated circuit (SOIC), shrink small outline package (SSOP), thin small outline (TSOP), thin quad flat pack (TQFP), system in package (SIP), multi chip package (MCP), wafer-level fabricated package (WFP), and wafer-level processed stack package (WSP).

While inventive concepts have been particularly shown and described with reference to some example embodiments thereof, it will be understood that various changes in form and details may be made therein without departing from the spirit and scope of the following claims.

What is claimed is:

1. A method of reading multi-bit data stored in a memory cell of a flash memory, the method comprising:
attempting, by an error correction circuit, to perform hard decision (HD) decoding on output data from the flash memory; and
performing, by the error correction circuit, soft decision (SD) decoding on the output data when the HD decoding cannot be performed, the performing the SD decoding including,
changing a maximum number of iterations of the SD decoding according to a threshold voltage distribution of the memory cell, and
performing the SD decoding based on the changed maximum number of iterations.

2. The method of claim 1, wherein the changing the maximum number of iterations comprises:
adjusting the maximum number of iterations based on a number of first cells having a threshold voltage between an HD read voltage and a first SD read voltage at a low voltage side of the HD read voltage, and a number of second cells having a threshold voltage between the HD read voltage and a second SD read voltage at a high voltage side of the HD read voltage, in adjacent data states of the threshold voltage distribution.

3. The method of claim 2, wherein the adjusting the maximum number of iterations comprises:
adjusting the maximum number of iterations to be less than an initial maximum number of iterations when a difference between the number of first cells and the number of second cells is greater than or equal to a first threshold; or
adjusting the maximum number of iterations to be greater than the initial maximum number of iterations when the difference between the number of first cells and the number of second cells is less than or equal to the first threshold; or
the adjusting adjusts the maximum number of iterations to be less than the initial maximum number of iterations when a sum of the number of first cells and the number of second cells is greater than or equal to a second threshold.

4. The method of claim 1, wherein the flash memory comprises a three-dimensional memory array.

5. The method of claim 4, wherein the flash memory is a three-dimensional memory including a non-volatile memory that is monolithically formed in one or more physical levels of memory cells having active areas disposed above a silicon substrate.

6. The method of claim 4, wherein the three dimensional memory array comprises a plurality of memory cells, each of the plurality of memory cells including a charge trap layer.

7. The method of claim 4, wherein at least one of word lines and bit lines in the three-dimensional memory array are shared between levels.

8. A method of reading multi-bit data stored in a memory cell of a flash memory, the method comprising:
attempting, by an error correction circuit, to perform hard decision (HD) decoding on output data from the flash memory; and
performing, by an error correction circuit, soft decision (SD) decoding on the output data when the HD decoding cannot be performed;
wherein the attempting to perform the HD decoding includes,
changing a maximum number of iterations of the HD decoding based on a success rate of an HD decoding stage of the HD decoding, and
performing the HD decoding based on the changed maximum number of iterations of the HD decoding.

9. The method of claim 8, wherein the changing the maximum number of iterations comprises:
setting the maximum number of iterations of the HD decoding to be less than an initial maximum number of iterations when the HD decoding stage has a minimum success rate in the performing of the HD decoding.

10. The method of claim 8, wherein the changing the maximum number of iterations comprises:
setting the maximum number of iterations of the HD decoding to be greater than an initial maximum number of iterations when the HD decoding stage has a maximum success rate in the performing of the HD decoding.

11. The method of claim 8, wherein the performing the SD decoding comprises:
changing a maximum number of iterations of the SD decoding based on a success rate of an SD decoding stage of the SD decoding; and
performing the SD decoding based on the changed maximum number of iterations of the SD decoding.

12. The method of claim 11, wherein the changing the maximum number of iterations of the SD decoding comprises:
setting the maximum number of iterations of the SD decoding to be less than an initial maximum number of iterations when the SD decoding stage has a minimum success rate in the performing of the SD decoding.

13. The method of claim 11, wherein the changing the maximum number of iterations of the SD decoding comprises:
setting the maximum number of iterations of the SD decoding to be greater than an initial maximum number of iterations when the SD decoding stage has a maximum success rate in the performing of the SD decoding.

14. A memory controller to read multi-bit data stored in a memory cell of a flash memory, the memory controller comprising:
an error correction circuit configured to,
attempt hard decision (HD) decoding of output data from the memory cell of the flash memory, a maximum number of iterations of the HD decoding being set according to a success rate of a stage of the HD decoding, and
perform soft decision (SD) decoding on the output data if the HD decoding is unsuccessful.

15. The memory controller of claim 14, wherein the error correction circuit is further configured to set the maximum number of iterations of the HD decoding to be less than an initial maximum number of iterations if the stage of the HD decoding has a minimum success rate of the HD decoding.

16. The memory controller of claim 14, wherein the error correction circuit is further configured to set the maximum number of iterations of the HD decoding to be greater than an initial maximum number of iterations if the stage of the HD decoding has a maximum highest success rate of the HD decoding.

17. The memory controller of claim 14, wherein the error correction circuit is further configured to,
   set a maximum number of iterations of the SD decoding according to a success rate of an SD decoding stage of the SD decoding, and
   perform the SD decoding based on the set maximum number of iterations of the SD decoding.

* * * * *